(12) United States Patent
Lin et al.

(10) Patent No.: US 12,136,660 B2
(45) Date of Patent: Nov. 5, 2024

(54) SEMICONDUCTOR DEVICE, AND METHOD FOR PROTECTING LOW-K DIELECTRIC FEATURE OF SEMICONDUCTOR DEVICE

(71) Applicant: TAIWAN SEMICONDUCTOR MANUFACTURING COMPANY, LTD., Hsinchu (TW)

(72) Inventors: Cheng-Ming Lin, Hsinchu (TW); Han-Yu Lin, Hsinchu (TW); Wei-Yen Woon, Hsinchu (TW); Mrunal Abhijith Khaderbad, Hsinchu (TW)

(73) Assignee: TAIWAN SEMICONDUCTOR MANUFACTURING COMPANY, LTD., Hsinchu (TW)

(*) Notice: Subject to any disclaimer, the term of this patent is extended or adjusted under 35 U.S.C. 154(b) by 204 days.

(21) Appl. No.: 17/370,265

(22) Filed: Jul. 8, 2021

(65) Prior Publication Data

US 2023/0009745 A1    Jan. 12, 2023

(51) Int. Cl.
| | | |
|---|---|---|
| *H01L 29/00* | (2006.01) | |
| *H01L 21/02* | (2006.01) | |
| *H01L 29/06* | (2006.01) | |
| *H01L 29/423* | (2006.01) | |
| *H01L 29/49* | (2006.01) | |
| *H01L 29/66* | (2006.01) | |
| *H01L 29/786* | (2006.01) | |

(52) U.S. Cl.
CPC .... *H01L 29/6656* (2013.01); *H01L 21/02321* (2013.01); *H01L 21/0259* (2013.01); *H01L 29/0665* (2013.01); *H01L 29/42392* (2013.01); *H01L 29/4908* (2013.01); *H01L 29/4983* (2013.01); *H01L 29/66545* (2013.01); *H01L 29/66742* (2013.01); *H01L 29/78696* (2013.01)

(58) Field of Classification Search
CPC ......... H01L 29/66553; H01L 29/66742; H01L 29/78696; H01L 29/66545
See application file for complete search history.

(56) References Cited

U.S. PATENT DOCUMENTS

| | | | |
|---|---|---|---|
| 10,797,163 B1* | 10/2020 | Yu | H01L 29/66439 |
| 2015/0221737 A1* | 8/2015 | Liao | H01L 29/4958 257/773 |
| 2016/0141381 A1* | 5/2016 | Kim | H01L 29/785 257/288 |
| 2016/0284820 A1* | 9/2016 | Basker | H01L 29/66795 |
| 2018/0301542 A1* | 10/2018 | Zhou | H01L 21/823821 |
| 2019/0148556 A1* | 5/2019 | Wang | H01L 21/28518 257/365 |
| 2020/0035804 A1* | 1/2020 | Chen | H01L 29/6653 |

* cited by examiner

*Primary Examiner* — Reema Patel
(74) *Attorney, Agent, or Firm* — Birch, Stewart, Kolasch & Birch, LLP

(57) ABSTRACT

A semiconductor device includes a semiconductor feature, a low-k dielectric feature that is formed on the semiconductor feature, and a Si-containing layer that contains elements of silicon and that covers over the low-k dielectric feature. The Si-containing layer can prevent the low-k dielectric feature from being damaged in etch and/or annealing processes for manufacturing the semiconductor device.

20 Claims, 29 Drawing Sheets

SEMICONDUCTOR DEVICE, AND METHOD FOR PROTECTING LOW-K DIELECTRIC FEATURE OF SEMICONDUCTOR DEVICE

BACKGROUND

With the growth of the semiconductor integrated circuit (IC) industry, circuits design becomes smaller and more complex, which increases complexity in processing and manufacturing ICs. Processes of manufacturing semiconductor devices are kept improved to overcome issues that may raise when the semiconductors are scaled down.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
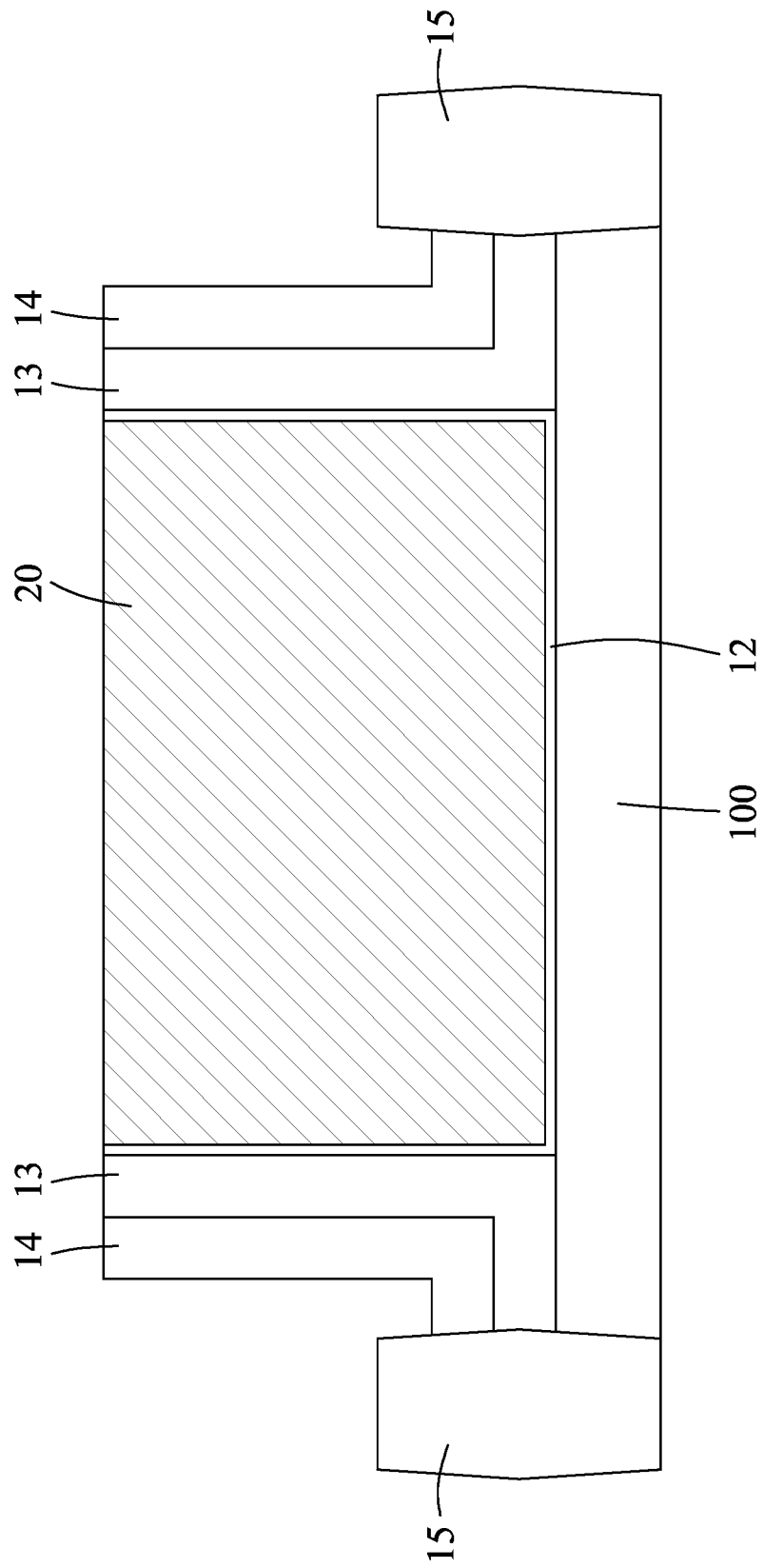
FIG. 1 is a schematic view illustrating a structure of a semiconductor device in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "top," "bottom," "up," "down," "on," "above," "over," "downwardly," "upwardly," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conventionally, $SiO_xC_yN_z$-based materials are used as low-k dielectric materials, which has a dielectric constant smaller than $SiO_2$, in semiconductor devices to reduce capacitance in circuits. However, the $SiO_xC_yN_z$-based materials usually have a dielectric constant greater than 3, which may not be sufficiently small in advanced technology nodes where device dimensions may be further scaled down. In order to reduce RC (resistance-capacitance) delay in the advanced technology nodes, the $SiO_xC_yN_z$-based materials may be replaced with materials with even smaller dielectric constant as being a low-k dielectric material. Some B(C)N-based materials (referring to boron-nitride-based material or boron-carbon-nitride-based materials and denoted as $BC_xN_y$) have a dielectric constant smaller than 2, and thus are potential candidates to replace the $SiO_xC_yN_z$-based materials as being a low-k dielectric material used in the semiconductor devices.

FIG. 1 illustrates a structure of a semiconductor device that is exemplified as a planar field-effect transistor (FET) or a FinFET that has a channel formed in a semiconductor feature 100. In accordance with some embodiments, the semiconductor feature 100 may be or include, for example, a semiconductor fin feature, a bulk monocrystalline silicon substrate, a silicon-on-insulator (SOI) substrate, or some other suitable semiconductor feature/substrate. The semiconductor device includes first spacers 13 formed on the semiconductor feature 100, a gate feature 20 formed between the first spacers 13, a gate dielectric 12 formed between the gate feature 20 and the semiconductor feature 100 and between the gate feature 20 and the first spacers 13, second spacers 14 conformally formed on the first spacers 13, and source/drain features 15 formed in the semiconductor feature 100 at opposite sides of the gate feature 20. The gate feature 20 may include metal or metal alloy. In accordance with some embodiments, the gate feature 20 may include, for example but not limited to, Ti, Ag, Al, TiAlN, TaC, TaCN, TaSiN, Mn, Zr, TiN, TaN, Ru, Mo, Al, WN, Cu, W, other suitable materials, or any combination thereof. The gate dielectric 12 may be one or more dielectric layers and include a high-k dielectric material, such as metal oxide. In accordance with some embodiments, the gate dielectric 12 may include, for example but not limited to, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, silicon oxynitrides (SiON), other suitable dielectric materials, or any combination thereof. The first spacers 13 and the second spacers 14 may include B(C)N-based materials, $SiO_xC_yN_z$-based materials, silicon nitride, other suitable materials, or any combination thereof. In the illustrative embodiment, the first spacers 13 and the second spacers 14 are made of B(C)N-based materials $BC_xN_y$, and have different composition ratios between carbon and nitrogen (i.e., different x and y). In accordance with some embodiments, x can be zero (e.g., using BN as the first spacers 13 or the second spacers 14). In accordance with some embodiments, the first spacers 13 are used to prevent diffusion of the high-k dielectric material from the gate dielectric 12, and thus have a higher proportion of nitrogen in comparison to the second spacers 14. In some embodiments, the first spacers 13 may be made of silicon nitride, and this disclosure is not limited in this respect. In accordance with some embodiments where the transistor is an n-type transistor, the source/drain features 15 may include, for example but not limited to, silicon, silicon carbide, phosphorous doped silicon carbide, silicon phosphide, or the like. In accordance with some embodiments where the transistor is a p-type transistor, the source/drain features 15 may include, for example but not limited to, silicon-germanium, boron doped silicon-germanium, germanium, germanium tin, or the like.

Figure 2:
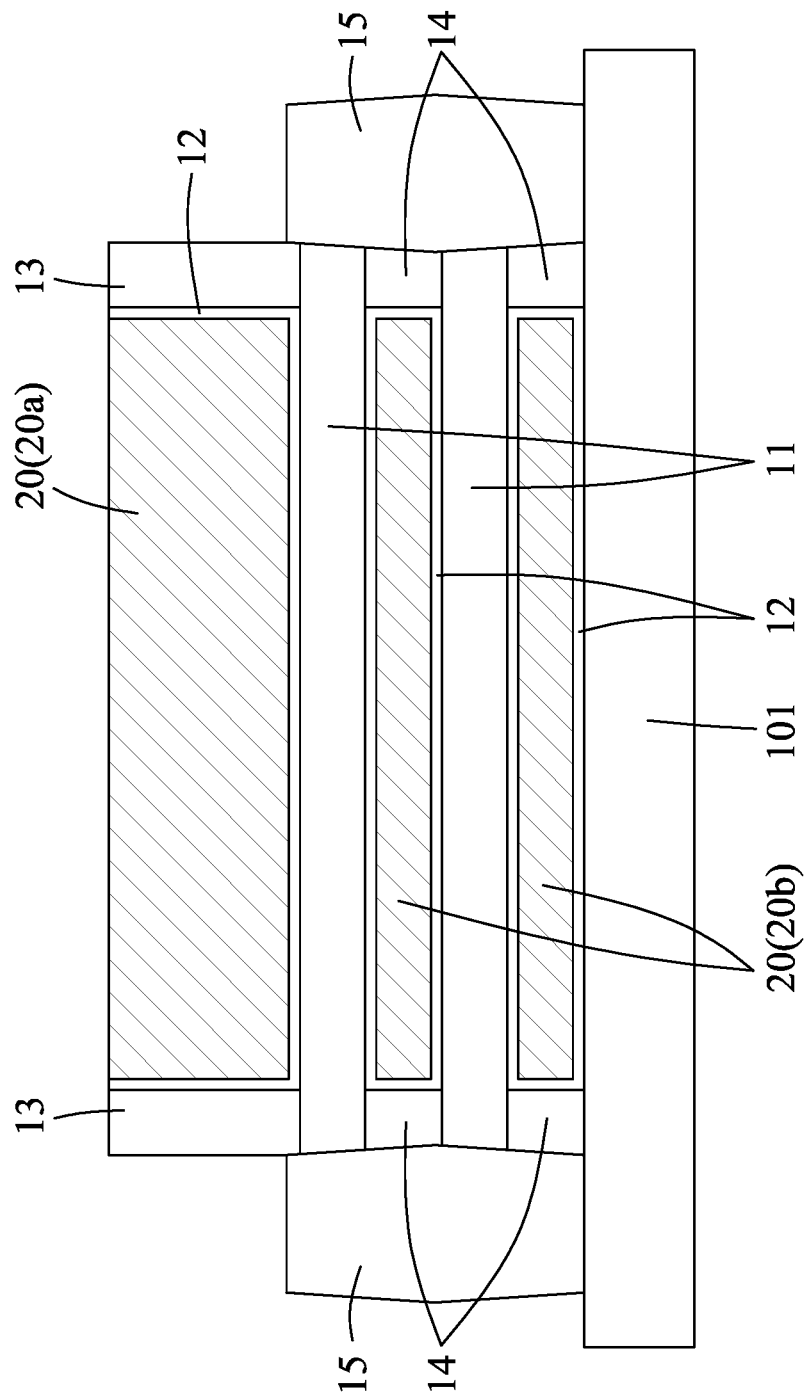
FIG. 2 is a schematic view illustrating another structure of a semiconductor device in accordance with some embodiments.

FIG. 2 illustrates a structure of a semiconductor device that is exemplified as a gate-all-around (GAA) FET, such as a nanosheet FET, a nanowire FET, etc. The semiconductor device includes multiple channel layers 11 disposed over a semiconductor substrate 101, a pair of source/drain features 15 respectively connected to opposite sides of the channel layers 11, a gate feature 20 surrounding the channel layers 11, first spacers 13 and second spacers 14 formed between the gate feature 20 and the source/drain features 15, and a gate dielectric layer 12 formed between the gate feature 20 and the first and second spacers 13, 14 and between the gate feature 20 and the channel layers 11. In the illustrative embodiment, the first spacers 13 are top spacers or outer spacers that are disposed between the source/drain features 15 and a top portion 20a of the gate feature 20, and the second spacers 14 are inner spacers that are disposed between the source/drain features 15 and a portion of the gate feature 20 that is formed between the channel layers 11. In accordance with some embodiments, the gate feature 20 may include metal or metal alloy that includes, for example but not limited to, Ti, Ag, Al, TiAlN, TaC, TaCN, TaSiN, Mn, Zr, TiN, TaN, Ru, Mo, Al, WN, Cu, W, other suitable materials, or any combination thereof. The gate dielectric 12 may be one or more dielectric layers and include a high-k dielectric material, such as metal oxide. In accordance with some embodiments, the gate dielectric 12 may include, for example but not limited to, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, silicon oxynitrides (SiON), other suitable dielectric materials, or any combination thereof. The first spacers 13 and the second spacers 14 may include B(C)N-based materials, $SiO_xC_yN_z$-based materials, silicon nitride, other suitable materials, or any combination thereof. In the illustrative embodiment, the first spacers 13 and the second spacers 14 are made of B(C)N-based materials $BC_xN_y$, and may have same or different composition ratios between carbon and nitrogen (i.e., same or different x and y). In accordance with some embodiments, x can be zero (e.g., using BN as the first spacers 13 or the second spacers 14). In order to achieve the effect of preventing diffusion of the high-k dielectric material from the gate feature 20, the first spacers 13 may be made of silicon nitride in accordance with some embodiments, and this disclosure is not limited in this respect. In accordance with some embodiments where the transistor is an n-type transistor, the source/drain features 15 may include, for example but not limited to, silicon, silicon carbide, phosphorous doped silicon carbide, silicon phosphide, or the like. In accordance with some embodiments where the transistor is a p-type transistor, the source/drain features 15 may include, for example but not limited to, silicon-germanium, boron doped silicon-germanium, germanium, germanium tin, or the like.

However, low-k dielectric materials are usually formed as a porous film, which may become instable after moisture exposure. Particularly, the B(C)N-based materials may react with moisture to generate $B_2O_3$, which is soluble in hot water (e.g., greater than 100° C.), and may thus encounter thickness loss and/or film property deterioration in subsequent wet etch process and/or annealing process.

Figure 3:
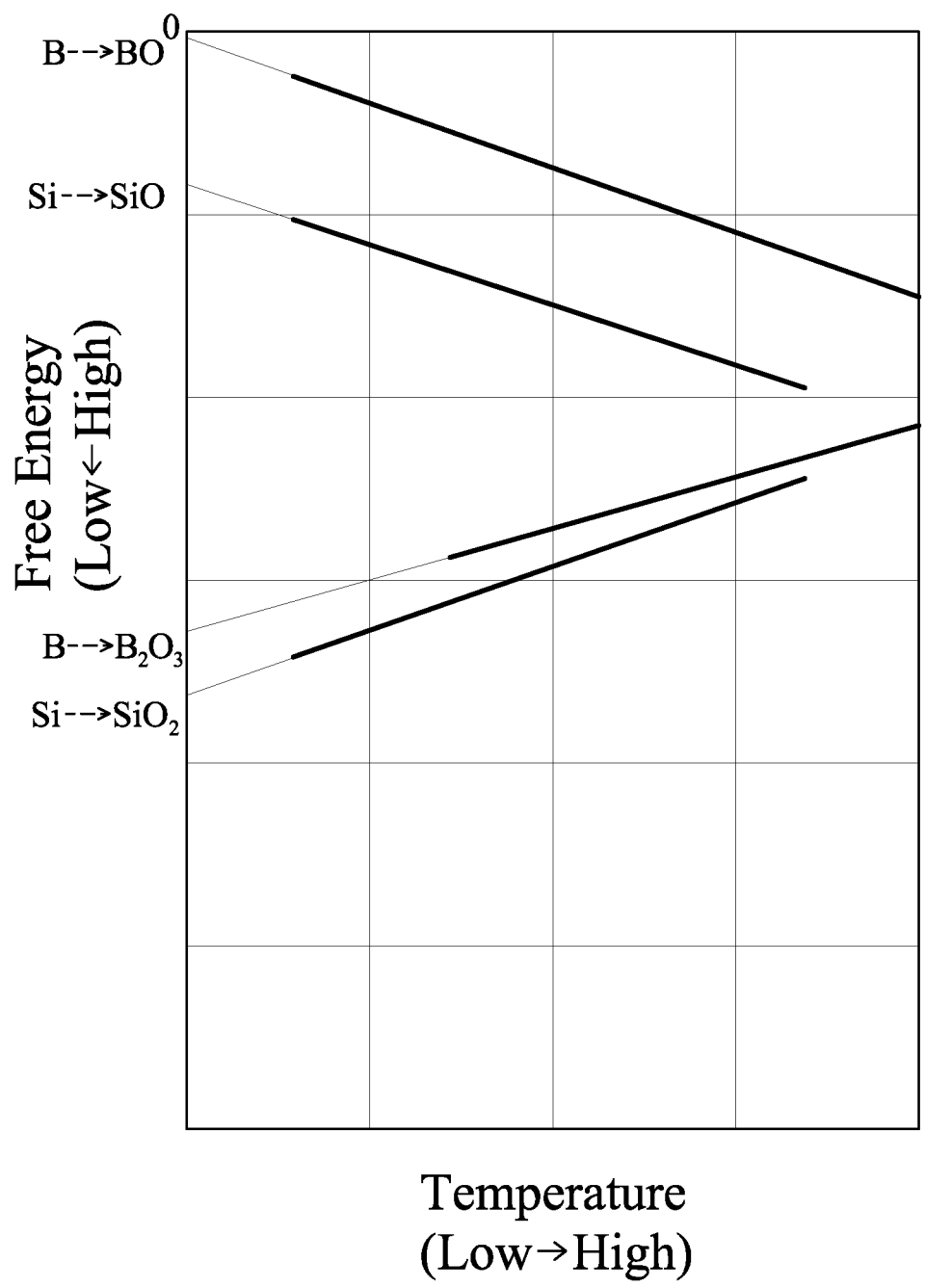
FIG. 3 is a plot comparing standard free energy between $B_2O_3$ and $SiO_2$.

Accordingly, this disclosure provides a method for protecting a feature made of a low-k dielectric material (referring to as low-k dielectric feature hereinafter) during a process of manufacturing semiconductor devices. FIG. 3 is a plot showing that $SiO_2$ has a smaller free energy than that of $B_2O_3$, which means that oxygen tends to react with silicon to form $SiO_2$ rather than reacting with boron to form $B_2O_3$. Therefore, when a Si-containing gas is used to perform treatment on the low-k dielectric feature, the silicon-containing gas may react with the low-k dielectric feature to form a Si-rich layer on a surface of the low-k dielectric feature. The Si-rich layer that covers over the low-k dielectric feature can protect the low-k dielectric feature from being damaged or deteriorated in subsequent processes. Usually, the Si-rich layer is formed in the very surface portion of the low-k dielectric feature, and is thinner than the low-k dielectric feature in the same thickness direction, but this disclosure is not limited in this respect. It is noted that the thickness direction of a feature refers to a growth direction of the feature, usually perpendicular to a surface on which the feature is formed, and thus may vary for different portions of the feature. For example, in FIG. 1, the thickness direction refers to a horizontal direction for a portion of the first spacer 13 that is deposited on a sidewall of the gate feature 20, and refers to a vertical direction for a portion of the first spacer 13 that is deposited on a top surface of the semiconductor feature 100.

Figure 4:
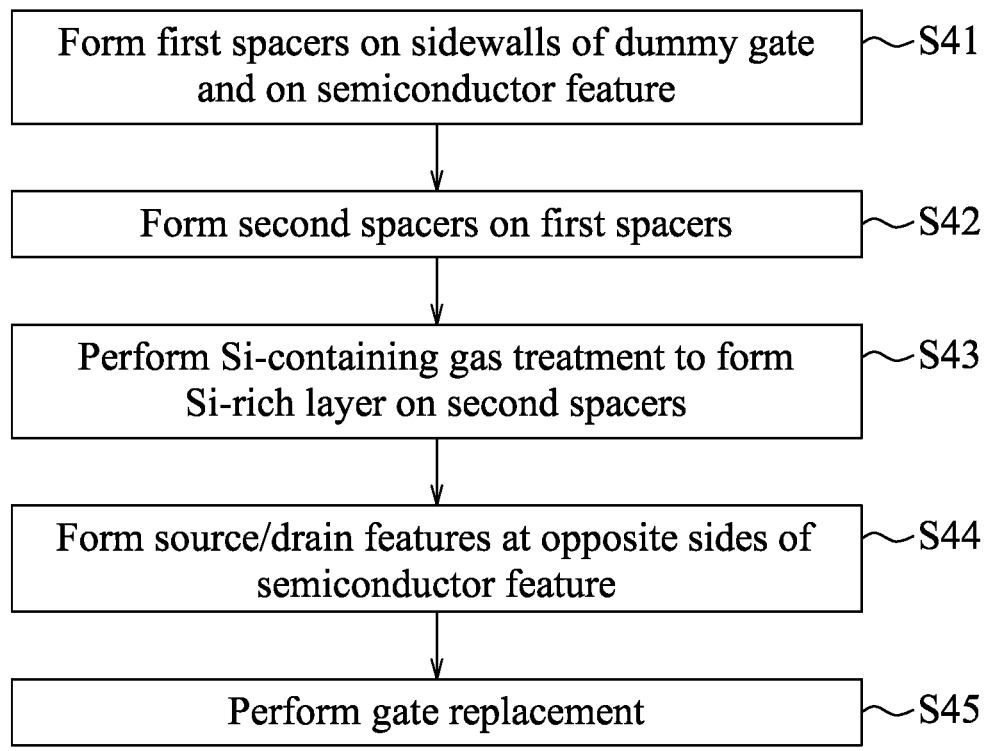
FIG. 4 is a flow chart illustrating steps of a method for protecting a low-k dielectric feature in accordance with some embodiments.

FIG. 4 illustrates a flow chart of a method for protecting a low-k dielectric feature in accordance with some embodiments. The flow chart is suitable for a semiconductor device having a structure as shown in FIG. 1.

Figure 5:
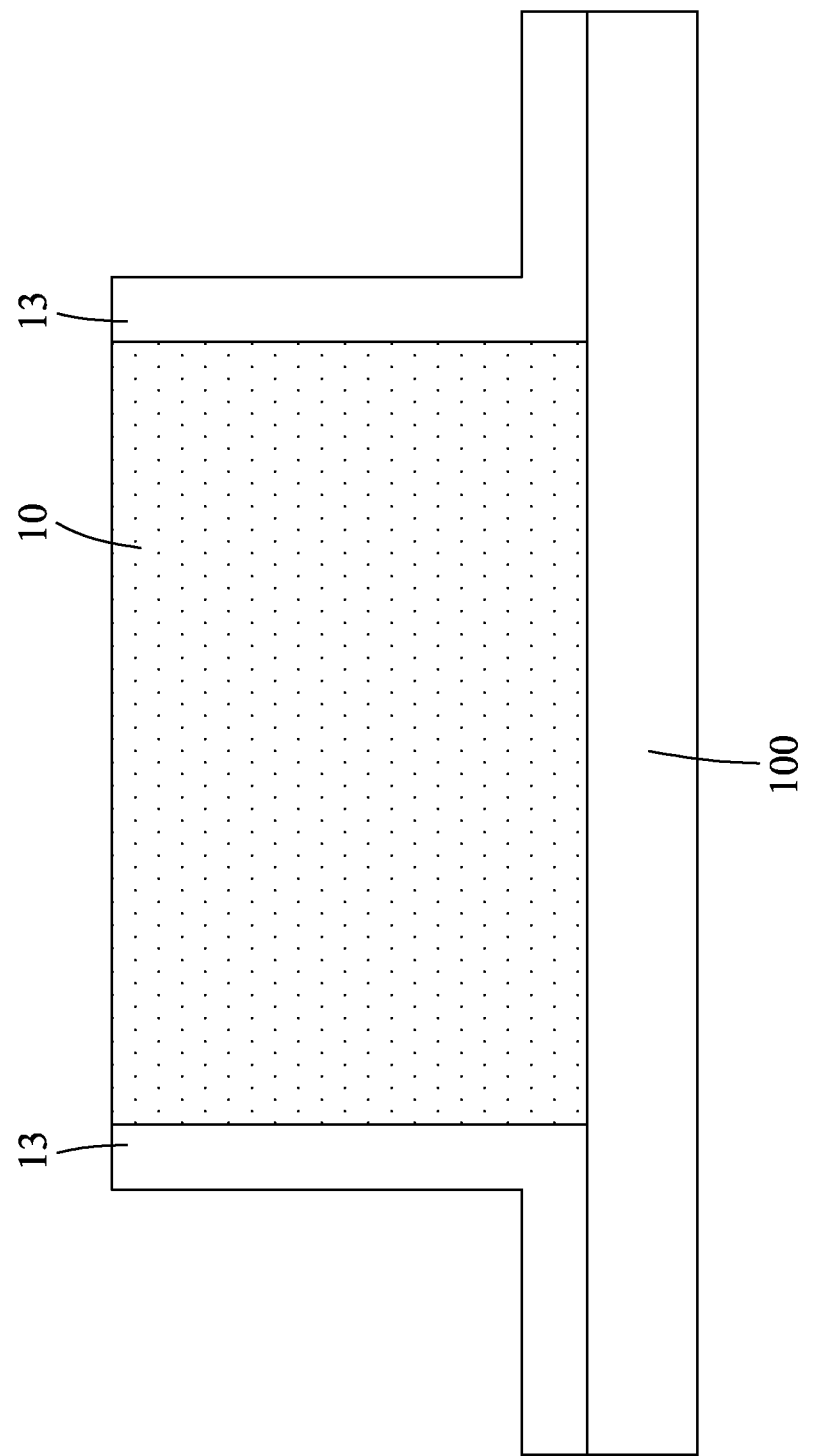
FIGS. 5 to 10 are schematic views illustrating intermediate stages of the method for making the semiconductor structure in accordance with some embodiments as depicted in FIG. 4.

Further referring to FIG. 5, a semiconductor feature 100 is provided with a dummy gate 10 formed thereover. In the illustrative embodiment, the semiconductor feature 100 is a fin feature formed on a semiconductor substrate (e.g., a wafer, not shown), and the dummy gate 10 is made of, for example but not limited to, polysilicon, other suitable materials, or any combination thereof. The semiconductor substrate may include: an elemental (single element) semiconductor material, such as silicon, germanium, and/or other suitable materials; a compound semiconductor material, such as silicon carbide, gallium arsenic, gallium phosphide, indium phosphide, indium arsenide, indium antimonide, and/or other suitable materials; and/or an alloy semiconductor material, such as SiGe, GaAsP, AlInAs, AlGaAs, GaInAs, GaInP, GaInAsP, and/or other suitable materials. In step S41, first spacers 13 are formed on sidewalls of the dummy gate 10 and on the semiconductor feature 100. The first spacers 13 may be made of, for example but not limited to, B(C)N-based materials, $SiO_xC_yN_z$-based materials, silicon nitride, other suitable materials, or any combination thereof. In the illustrative embodiment, the first spacers 13 are made of silicon nitride that has good capability in preventing diffusion of high-k dielectric materials that would be used to form a gate dielectric 12 (see FIG. 10) in a subsequent process step. The first spacers 13 may be formed using, for example but not limited to, chemical vapor deposition (CVD), atomic layer deposition (ALD), other suitable methods, or any combination thereof, at a temperature in a range from about 200° C. to about 600° C. In accordance with some embodiments, the first spacers 13 may have a thickness in a range from about 50 angstroms to about 100 angstroms, but this disclosure is not limited in this respect. Excessively thin first spacers 13 (e.g., thinner than 50 angstroms) may lead to gate-to-drain or gate-to-source current leakages, and excessively thick first spacers 13 (e.g., thicker than 100 angstroms) may make the entire device unnecessarily large.

Figure 6:
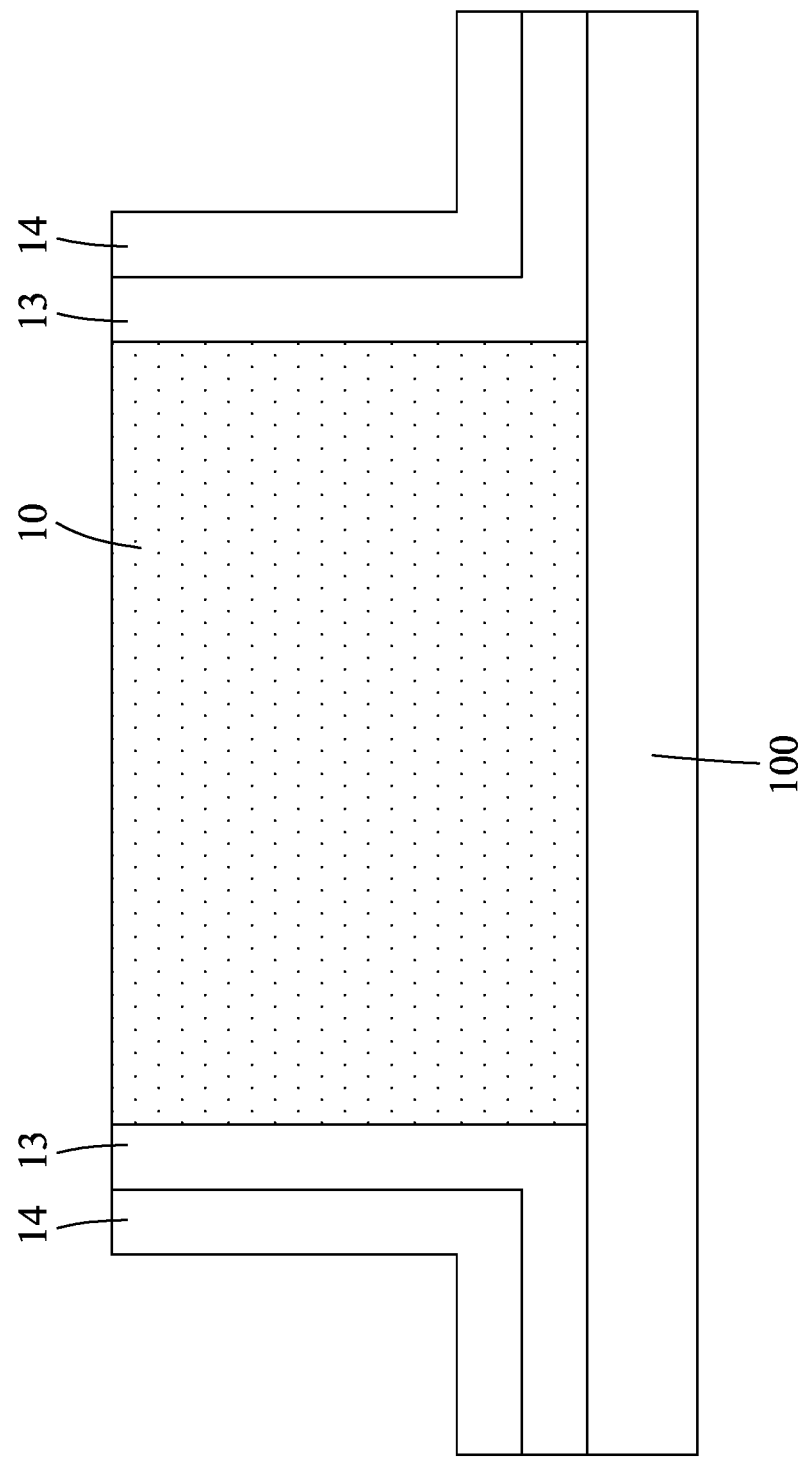

Referring to FIGS. 4 and 6, in step S42, second spacers 14 (low-k dielectric feature) are conformally formed on the first spacers 13. In accordance with some embodiments, the second spacers 14 are made of a low-k dielectric material that includes, for example but not limited to, $BC_xN_y$-based materials, $SiO_xC_yN_z$-based materials, other suitable materials, or any combination thereof, in order to reduce capacitance in circuits. In the illustrative embodiment, the second spacers 14 are made of $BC_xN_y$-based materials. The second spacers 14 may be formed using, for example but not limited to, CVD, ALD, other suitable methods, or any combination thereof, at a temperature in a range from about 200° C. to about 600° C. In accordance with some embodiments, second spacers 14 may have a thickness in a range from about 50 angstroms to about 100 angstroms, but this disclosure is not limited in this respect. Excessively thin second spacers 14 (e.g., thinner than 50 angstroms) may lead to gate-to-drain or gate-to-source current leakages, and excessively thick second spacers 14 (e.g., thicker than 100 angstroms) may make the entire device unnecessarily large.

Figure 7:
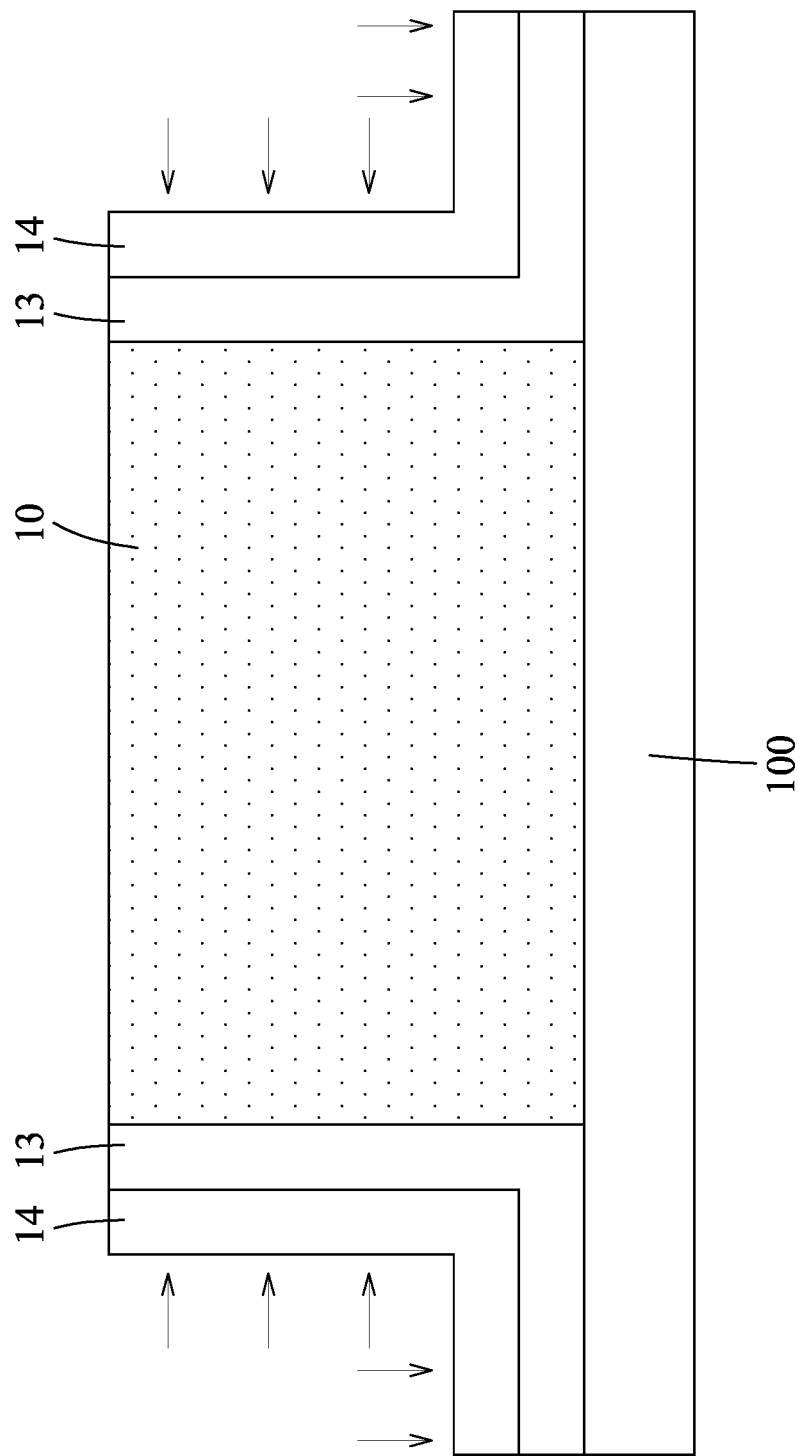
Figure 8:
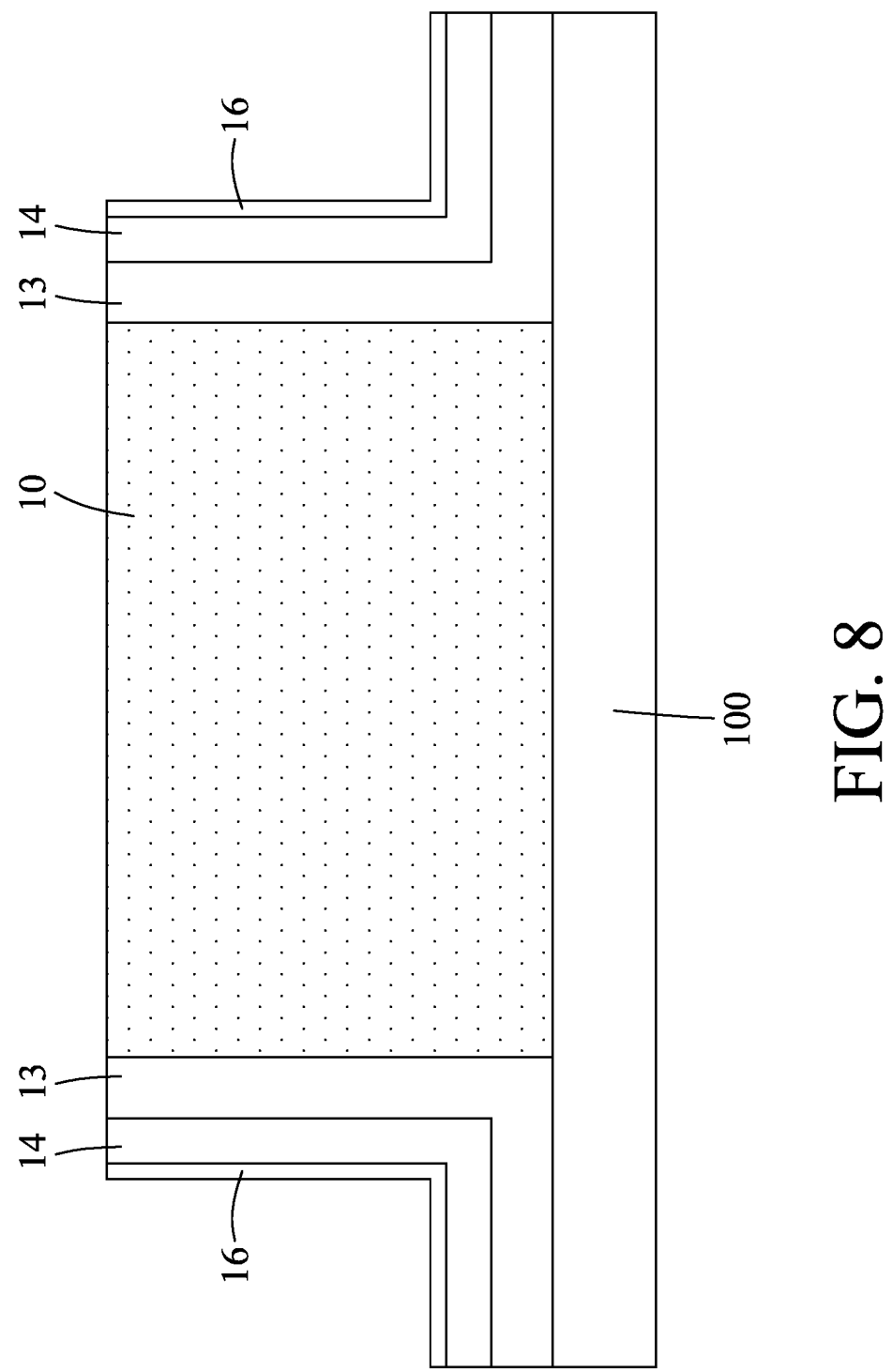

Referring to FIGS. 4 and 7, in step S43, a Si-containing gas is introduced (into a vacuum chamber where the semiconductor substrate is placed) to the second spacers 14, so that Si contained in the Si-containing gas reacts with the material of the second spacers 14 to form a Si-rich layer 16 (or Si-containing layer) on a surface of the second spacers 14 (see FIG. 8). The Si-rich layer 16 (or Si-containing layer) can be detected using, for example but not limited to, energy-dispersive X-ray spectroscopy (EDS) and/or electron energy loss spectroscopy (EELS). Generally, the treatment of the Si-containing gas is isotropic, but this disclosure is not limited in this respect. In accordance with some embodiments, the Si-containing gas treatment is performed at a temperature in a range from about 200° C. to about 600° C., a pressure in a range from about 1 mTorr to about 10 Torr, with a treatment duration in a range from about 10 seconds to about 600 seconds, so as to form the Si-rich layer 16 that has a thickness in a range from about 5 angstroms to about 10 angstroms, which is sufficient to protect the second spacers 14 from being damaged in subsequent etch and/or annealing processes. If the process temperature is too low (e.g., lower than 200° C.), the Si-containing gas may not be able to effectively react with the low-k dielectric material. If the process temperature is too high (e.g., higher than 600° C.), undesired diffusion of Si into the low-k dielectric material may occur. If the process pressure is too low (e.g., lower than 1 mTorr), the Si-containing gas may not be able to effectively react with the low-k dielectric material. If the process pressure is too high (e.g., higher than 10 Torr), contaminations of particles may occur. In accordance with some embodiments, the Si-containing gas may include, for example but not limited to, $SiH_4$, $Si_2H_6$, $SiH_xCl_y$, other suitable materials, or any combination thereof. The Si-containing gas treatment may be either an in-situ treatment or an ex-situ treatment. In the case that the Si-containing gas treatment is an in-situ treatment, the semiconductor substrate stays in a vacuum chamber where the previous process (e.g., the process of forming the second spacers 14 in the illustrative embodiment) is performed and the Si-containing gas treatment is directly performed on the semiconductor substrate in the same vacuum chamber, so the low-k dielectric material of the second spacers 14 may not be exposed to moisture and thus would not be oxidized. In the case that the second spacers 14 includes the B(C)N-based low-k dielectric material, the Si-rich layer 16 formed by the reaction between the Si-containing gas and the material of the second spacers 14 may include, for example but not limited to, Si, SiN, SiBN, SiBCN, and so on, which can protect the low-k dielectric material of the second spacers 14 from being damaged during subsequent etch and/or annealing processes. In the case that the Si-containing gas treatment is an ex-situ treatment, the semiconductor substrate would be transferred to another vacuum chamber for the Si-containing gas treatment. During the transferring, the low-k dielectric material of the second spacers 14 may be exposed to moisture and thus may be oxidized. In the case that the second spacers 14 including the B(C)N-based low-k dielectric material have been oxidized to form $B_2O_3$, the Si-rich layer 16 formed by the reaction between the Si-containing gas and the second spacers 14 may further include $SiO_2$, which is generated by the reaction between Si of the Si-containing gas and oxygen of $B_2O_3$ and which is more stable than $B_2O_3$. In the case that the second spacers 14 includes the $SiO_xC_yN_z$-based low-k dielectric material, the Si-rich layer 16 formed by the reaction between the Si-containing gas and the material of the second spacers 14 may include, for example but not limited to, Si, SiN, SiON, $SiO_2$, and so on, which can protect the low-k dielectric material of the second spacers 14 from being damaged during subsequent etch and/or annealing processes.

Figure 9:
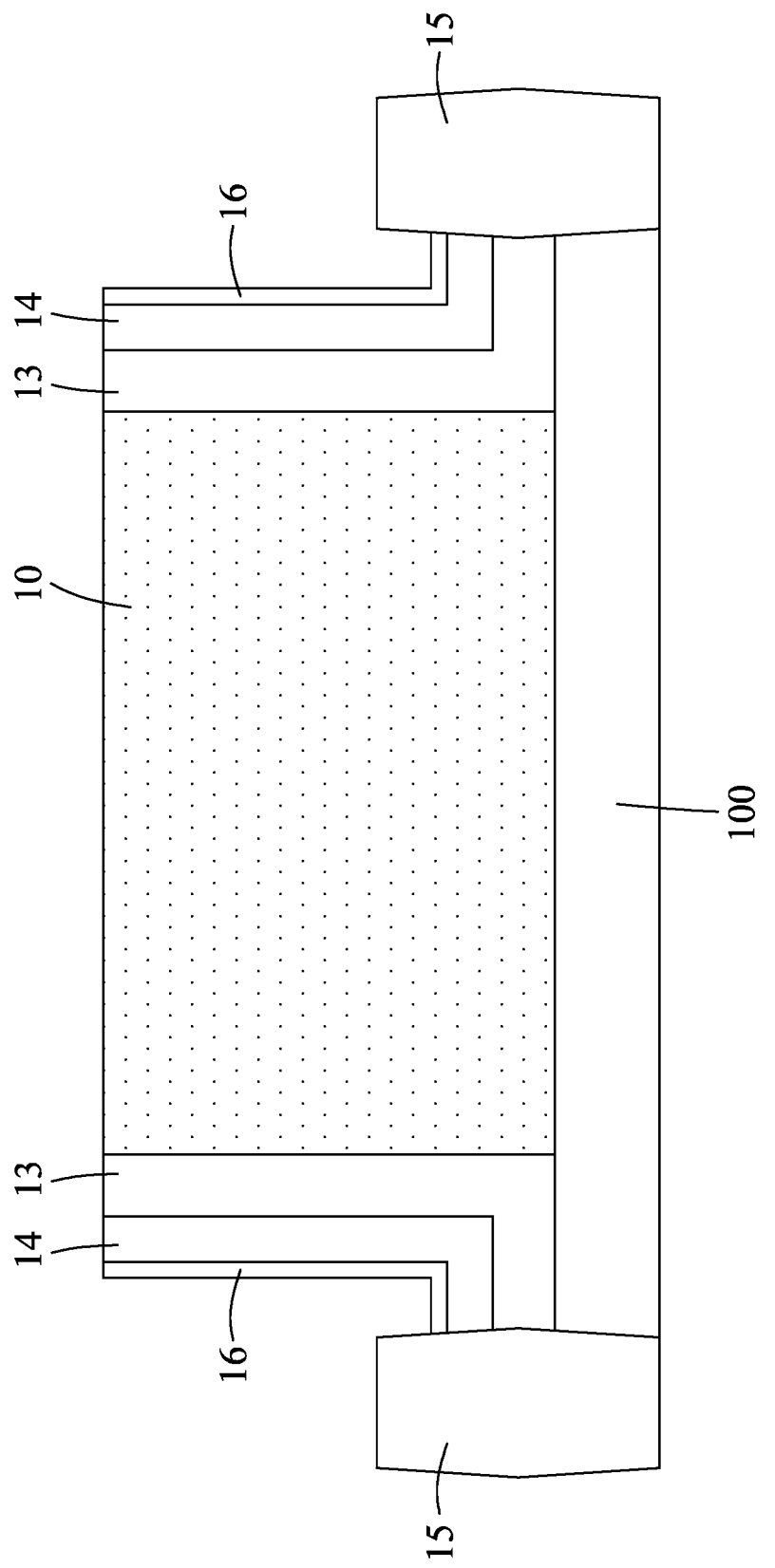

Referring to FIGS. 4 and 9, in step S44, source/drain features 15 are formed in the semiconductor feature 100 at opposite sides of the semiconductor feature 100. In detail, a part of the semiconductor feature 100 disposed at two opposite sides of the dummy gate 10, and the Si-rich layer 16, the second spacers 14, and the first spacers 13 formed on the part of the semiconductor feature 100 are etched using, for example but not limited to, dry etching, wet etching, reactive ion etching (RIE), atomic layer etching (ALE), other suitable methods, or any combination thereof, so as to form recesses in the semiconductor feature 100 at the opposite sides of the semiconductor feature 100. The recesses are disposed at two opposite sides of the dummy gate 10. Then, the source/drain features 15 are formed in the recesses by, for example but not limited to, an epitaxy process.

Figure 10:
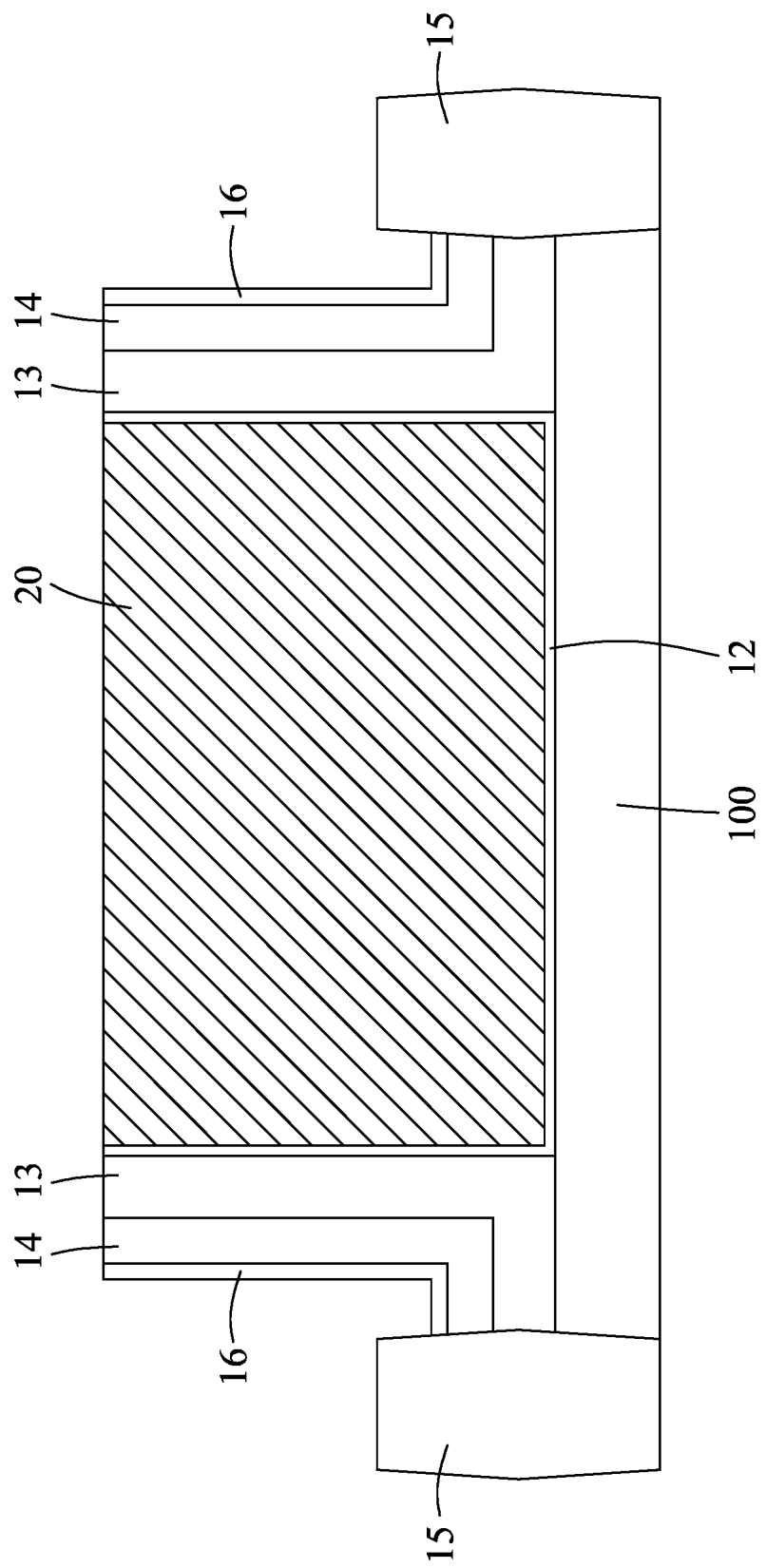

Referring to FIGS. 4 and 10, in step S45, a gate replacement process is performed to replace the dummy gate 10 with a gate dielectric 12 and a gate feature 20. In detail, the dummy gate 10 is etched by, for example but not limited to, dry etching, wet etching, RIE, ALE, other suitable methods, or any combination thereof, so as to form a trench between the first spacers 13. Then, the gate dielectric 12 is conformally formed in the trench using, for example but not limited to, PVD, CVD, ALD, other suitable methods, or any combination thereof. The gate dielectric 12 may be one or more dielectric layers and include a high-k dielectric material, such as metal oxide. In accordance with some embodiments, the gate dielectric 12 may include, for example but not limited to, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, Si$_3$N$_4$, silicon oxynitrides (SiON), other suitable dielectric materials, or any combination thereof. Then, the gate feature 20 is formed on the gate dielectric 12 in the trench using, for example but not limited to, PVD, CVD, ALD, other suitable methods, or any combination thereof. The gate feature 20 may include metal or metal alloy that includes, for example but not limited to, Ti, Ag, Al, TiAlN, TaC, TaCN, TaSiN, Mn, Zr, TiN, TaN, Ru, Mo, Al, WN, Cu, W, other suitable materials, or any combination thereof.

As a result, the semiconductor device as exemplified in FIG. 10 includes a semiconductor feature 100, a pair of first spacers 13, a pair of second spacers 14 (low-k features) and a gate feature 20 formed on the semiconductor feature 100, a gate dielectric 12, a Si-containing layer 16, and a pair of source/drain features 15 that are form at opposite sides of the semiconductor feature 100 (also at opposite sides of the gate feature 20). The first spacers 13 are respectively formed on opposite side walls of the gate feature 20 adjacent to the source/drain features 15 so that the first spacers 13 are spaced apart from each other by the gate feature 20. In certain embodiments, the first spacers 13 may also be formed on a surface of the semiconductor feature 100 located between the gate feature 20 and the source/drain features 15. The second spacers 14 are respectively formed on the first spacers opposite to the gate feature 20 so that the second spacers 14 are spaced apart from each other. Thus, the gate feature 20 is sandwiched between the first spacers 13, and also between the second spacers 14. The gate dielectric 12 is formed between the gate feature 20 and the first spacers 13 (also between the gate feature 20 and the second spacer 14) and between the gate feature 20 and the semiconductor feature 100. The Si-containing layer 16 contains silicon and is formed on the second spacers 14 that is opposite to the gate feature 20.

In the embodiment as illustrated in FIGS. 5 through 10, since the first spacers 13 are formed using silicon nitride that is relatively inactive with moisture as compared to low-k dielectric materials, it is not necessary to perform the Si-containing gas treatment on the first spacers even if the depositions of the first spacers 13 and the second spacers 14 are not performed in the same vacuum chamber.

Figure 11:
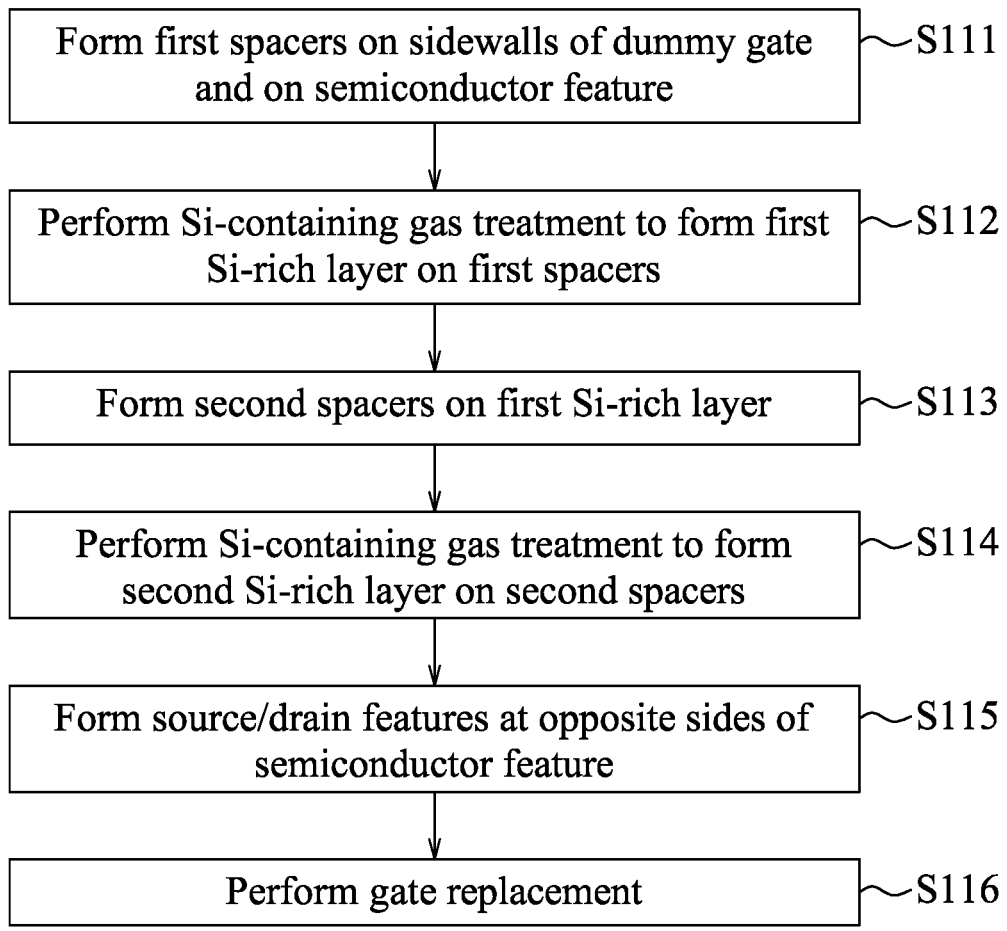
FIG. 11 is a flow chart illustrating steps of a method for protecting a low-k dielectric feature in accordance with some embodiments.

FIG. 11 illustrates a flow chart of a method for protecting a low-k dielectric feature in accordance with some embodiments. The flow chart is suitable for a semiconductor device having a structure as shown in FIG. 1. The flow chart in FIG. 11 is different from the flow chart in FIG. 4 in that the flow chart in FIG. 11 is more suitable for the semiconductor device having the first spacers 13 include a low-k dielectric material.

Figure 12:
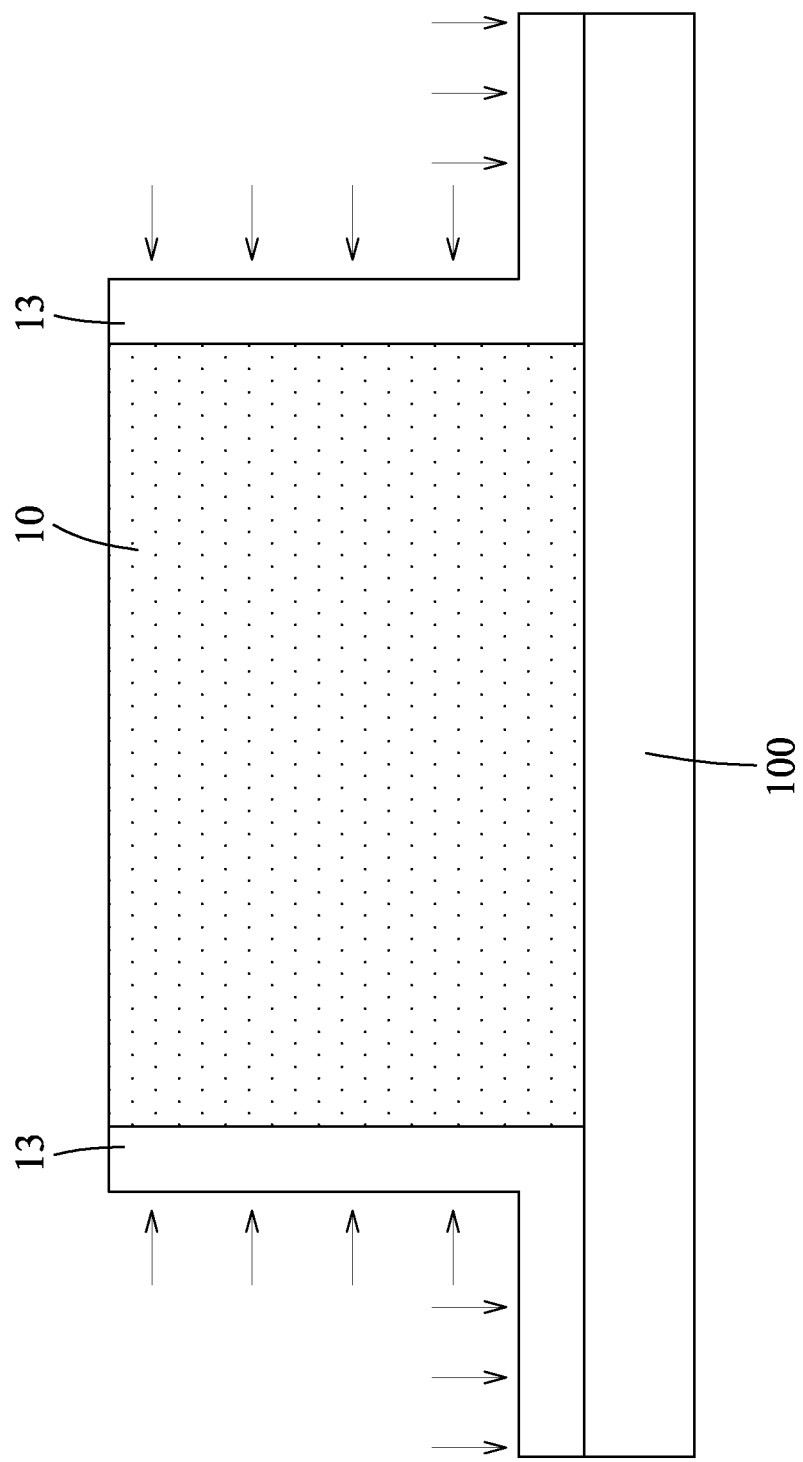
FIGS. 12 to 18 are schematic views illustrating intermediate stages of the method for protecting a low-k dielectric feature in accordance with some embodiments as depicted in FIG. 11.

Further referring to FIG. 12, a semiconductor feature 100 is provided with a dummy gate 10 formed thereover. In the illustrative embodiment, the semiconductor feature 100 is a fin feature formed on a semiconductor substrate (e.g., a wafer, not shown), and the dummy gate 10 is made of, for example but not limited to, polysilicon, other suitable materials, or any combination thereof. The semiconductor substrate may include: an elemental (single element) semiconductor material, such as silicon, germanium, and/or other suitable materials; a compound semiconductor material, such as silicon carbide, gallium arsenic, gallium phosphide, indium phosphide, indium arsenide, indium antimonide, and/or other suitable materials; and/or an alloy semiconductor material, such as SiGe, GaAsP, AlInAs, AlGaAs, GaInAs, GaInP, GaInAsP, and/or other suitable materials. In step S111, first spacers 13 are formed on sidewalls of the dummy gate 10 and on the semiconductor feature 100. In the illustrative embodiment, the first spacers 13 are a low-k dielectric feature that is made of a low-k dielectric material, for example but not limited to, BC$_x$N$_y$-based materials, SiO$_x$C$_y$N$_z$-based materials, other suitable materials, or any combination thereof, in order to reduce capacitance in circuits. The first spacers 13 may be formed using, for example but not limited to, CVD, ALD, other suitable methods, or any combination thereof, at a temperature in a range from about 200° C. to about 600° C. In accordance with some embodiments, the first spacers 13 may have a thickness in a range from about 50 angstroms to about 100 angstroms, but this disclosure is not limited in this respect. Excessively thin first spacers 13 (e.g., thinner than 50 angstroms) may lead to gate-to-drain or gate-to-source current leakages, and excessively thick first spacers 13 (e.g., thicker than 100 angstroms) may make the entire device unnecessarily large.

Figure 13:
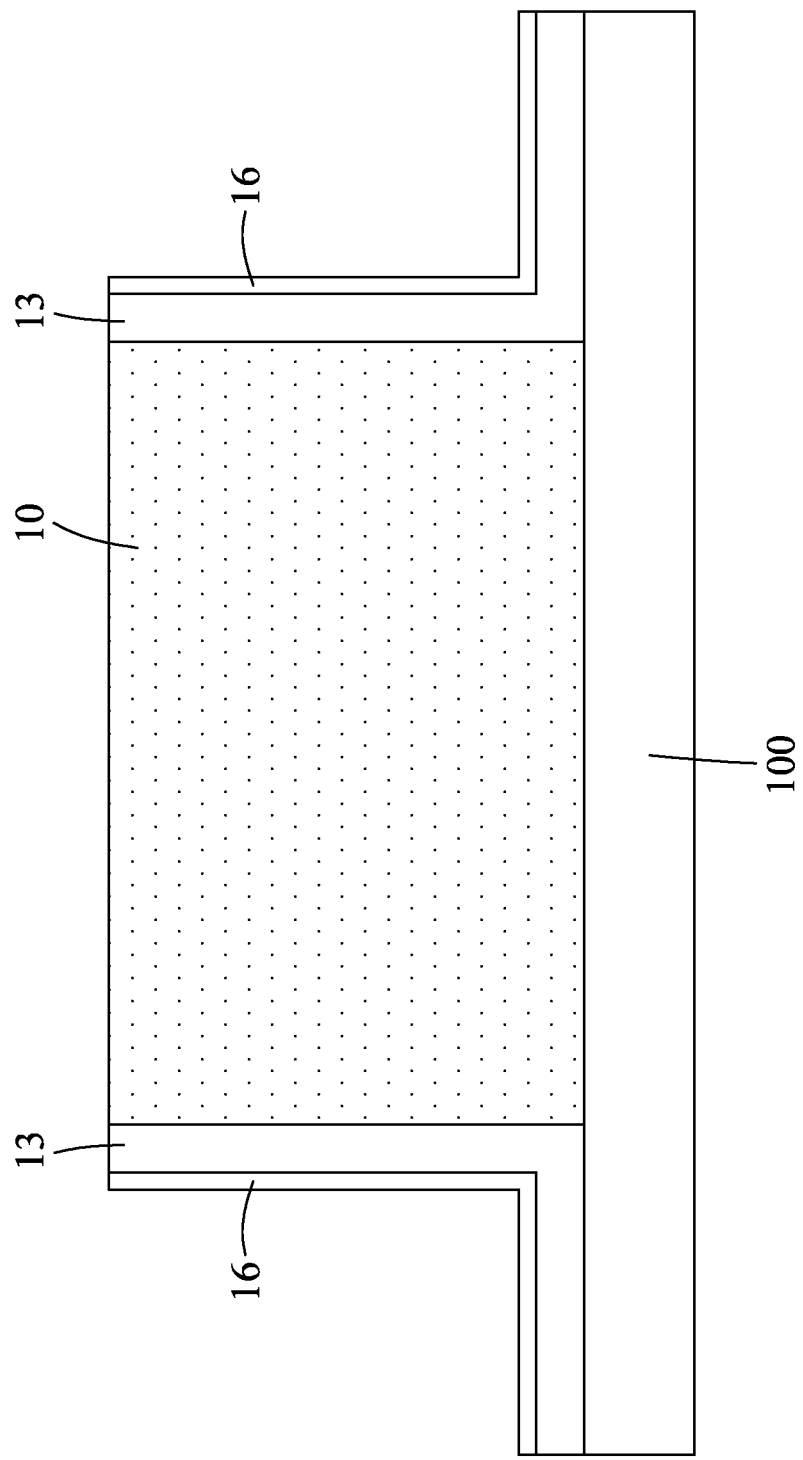

Since the first spacers 13 are made of the low-k dielectric material that is relatively easy to react with moisture, a Si-containing gas treatment is performed on the first spacers 13 in order to form a Si-rich layer on a surface of the first spacers 13 to isolate the low-k dielectric material from moisture in subsequent processes. Referring to FIGS. 11 and 12, in step S112, a Si-containing gas is introduced to the first spacers 13, so that Si contained in the Si-containing gas reacts with the material of the first spacers 13 to form a first Si-rich layer 16 (or Si-containing layer) on the surface of the first spacers 13 (see FIG. 13). Generally, the treatment of the Si-containing gas is isotropic, but this disclosure is not limited in this respect. In accordance with some embodiments, the Si-containing gas treatment is performed at a temperature in a range from about 200° C. to about 600° C., a pressure in a range from about 1 mTorr to about 10 Torr, with a treatment duration in a range from about 10 seconds to about 600 seconds, so as to form the first Si-rich layer 16 that has a thickness in a range from about 5 angstroms to about 10 angstroms, which is sufficient to protect the first spacers 13 from being damaged in subsequent etch and/or annealing processes. If the process temperature is too low (e.g., lower than 200° C.), the Si-containing gas may not be able to effectively react with the low-k dielectric material. If the process temperature is too high (e.g., higher than 600° C.), undesired diffusion of Si into the low-k dielectric material may occur. If the process pressure is too low (e.g., lower than 1 mTorr), the Si-containing gas may not be able to effectively react with the low-k dielectric material. If the process pressure is too high (e.g., higher than 10 Torr), undesired contaminations of particles may occur. In accordance with some embodiments, the Si-containing gas may include, for example but not limited to, SiH$_4$, Si$_2$H$_6$, SiH$_x$Cl$_y$, other suitable materials, or any combination thereof. The Si-containing gas treatment in step S112 may be either an in-situ treatment or an ex-situ treatment. In the case that the first spacers 13 includes the B(C)N-based low-k dielectric material, the first Si-rich layer 16 formed by the reaction between the Si-containing gas and the material of the first spacers 13 may include, for example but not limited to, Si, SiN, SiBN, SiBCN, and so on, which can protect the first spacers 13 from being damaged during subsequent etch and/or annealing processes. In the case that the first spacers 13 including the B(C)N-based low-k dielectric material have been oxidized to form B$_2$O$_3$, the first Si-rich layer 16 formed by the reaction between the Si-containing gas and the material of the first spacers 13 may further include SiO$_2$, which is generated by the reaction between Si of the Si-containing gas and oxygen of B$_2$O$_3$ and which is more stable than B$_2$O$_3$. In the case that the first spacers 13 includes the SiO$_x$C$_y$N$_z$-based low-k dielectric material, the Si-rich layer 16 formed by the reaction between the Si-containing gas and the material of the first spacers 13 may include, for example but not limited to, Si, SiN, SiON, SiO$_2$, and so on, which can protect the low-k dielectric material of the first spacers 13 from being damaged during subsequent etch and/or annealing processes.

Figure 14:
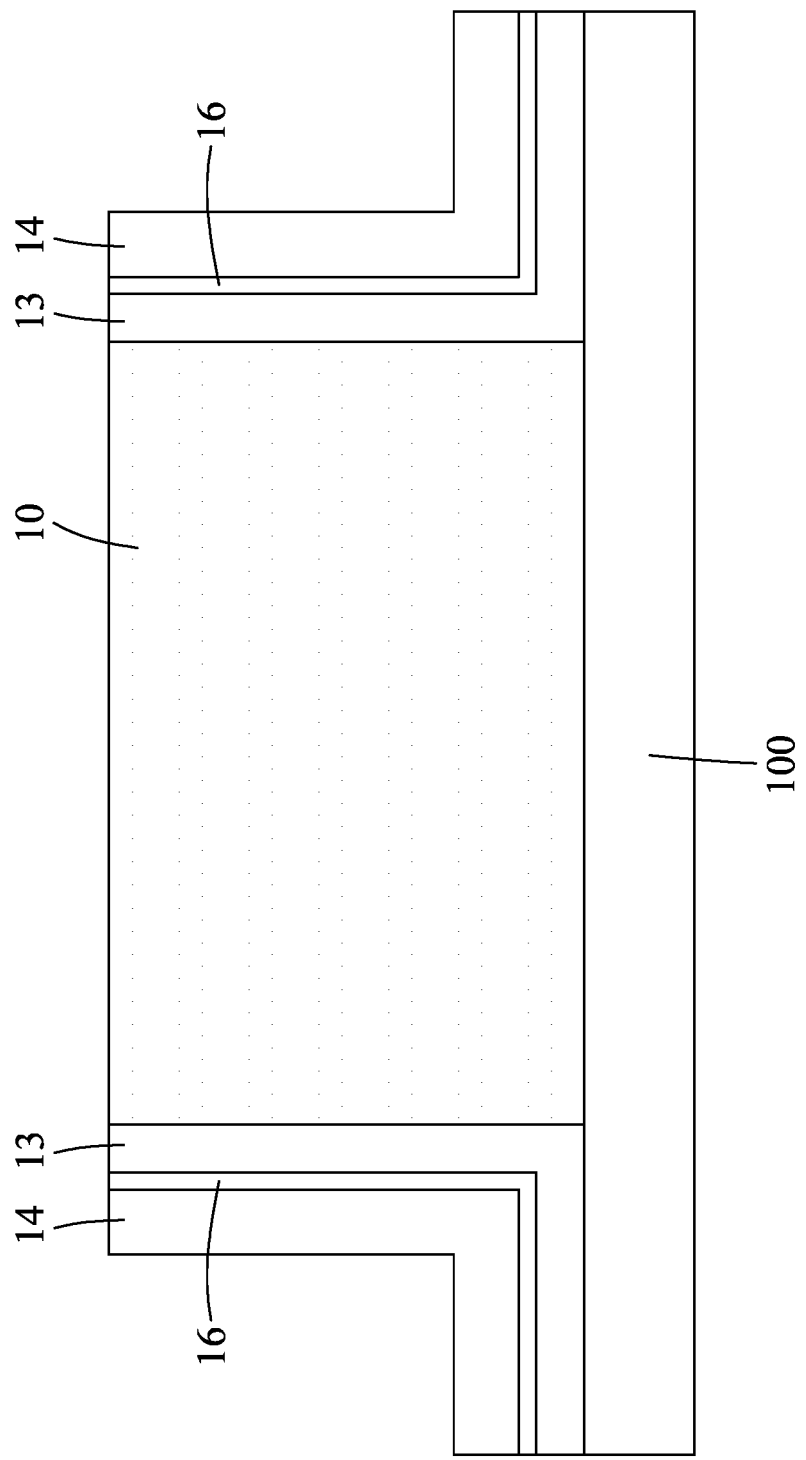

Referring to FIGS. 11 and 14, in step S113, second spacers 14 (low-k dielectric feature) are conformally formed on the first Si-rich layer 16. In accordance with some embodiments, the second spacers 14 are made of a low-k dielectric material that includes, for example but not limited to, BC$_x$N$_y$-based materials, SiO$_x$C$_y$N$_z$-based materials, other suitable materials, or any combination thereof, in order to reduce capacitance in circuits. In the illustrative embodiment, the second spacers 14 are made of BC$_x$N$_y$-based materials. The second spacers 14 may be formed using, for example but not limited to, CVD, ALD, other suitable methods, or any combination thereof, at a temperature in a range from about 200° C. to about 600° C. In accordance with some embodiments, the second spacers 14 may have a thickness in a range from about 50 angstroms to about 100 angstroms, but this disclosure is not limited in this respect. In accordance with some embodiments, the first spacers 13 have a higher proportion of nitrogen in comparison to the second spacers 14 because the first spacers 13 are used to prevent diffusion of the high-k dielectric material from a gate dielectric 12 (see FIG. 18), which would be formed in a subsequent process. Excessively thin second spacers 14 (e.g., thinner than 50 angstroms) may lead to gate-to-drain or gate-to-source current leakages, and excessively thick second spacers 14 (e.g., thicker than 100 angstroms) may make the entire device unnecessarily large.

Figure 15:
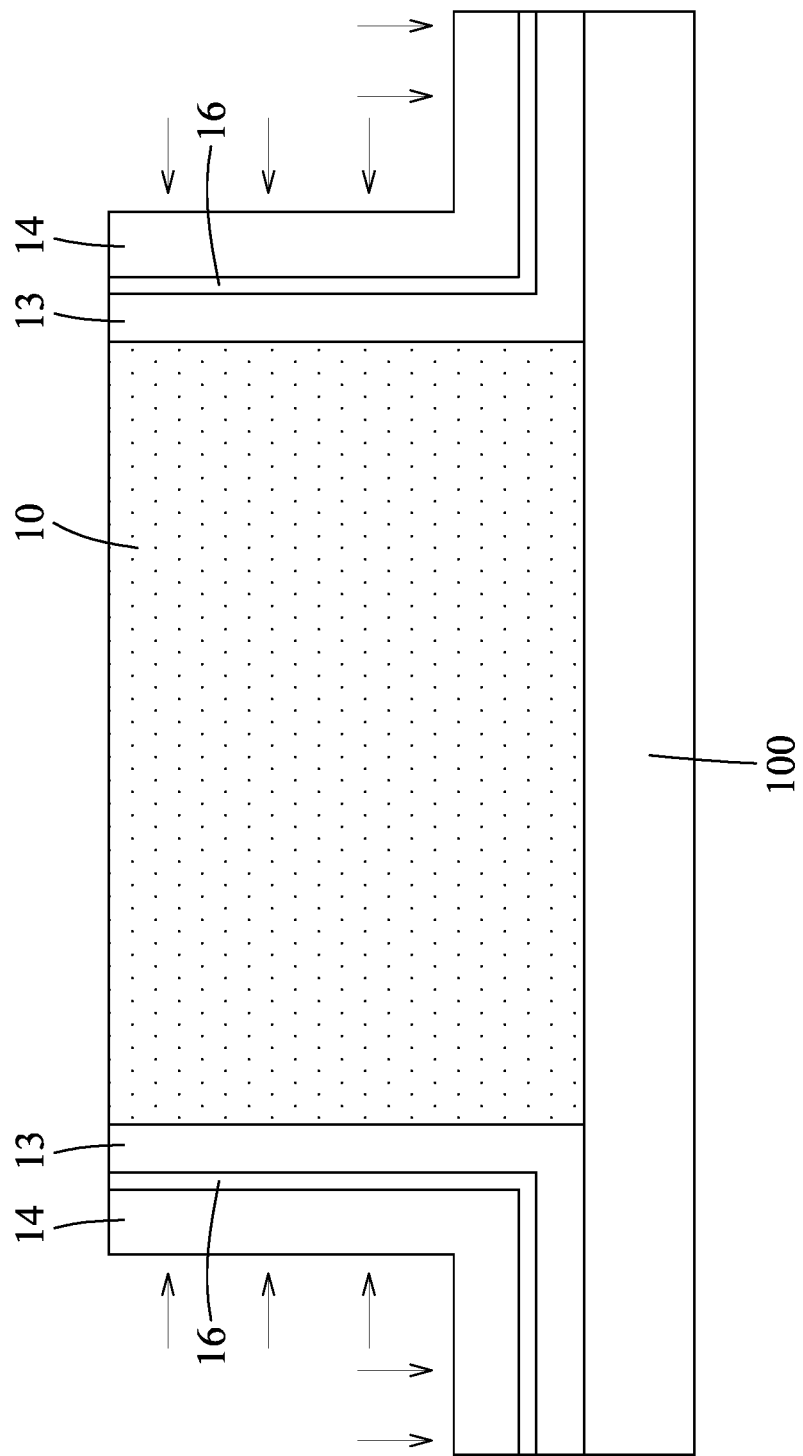
Figure 16:
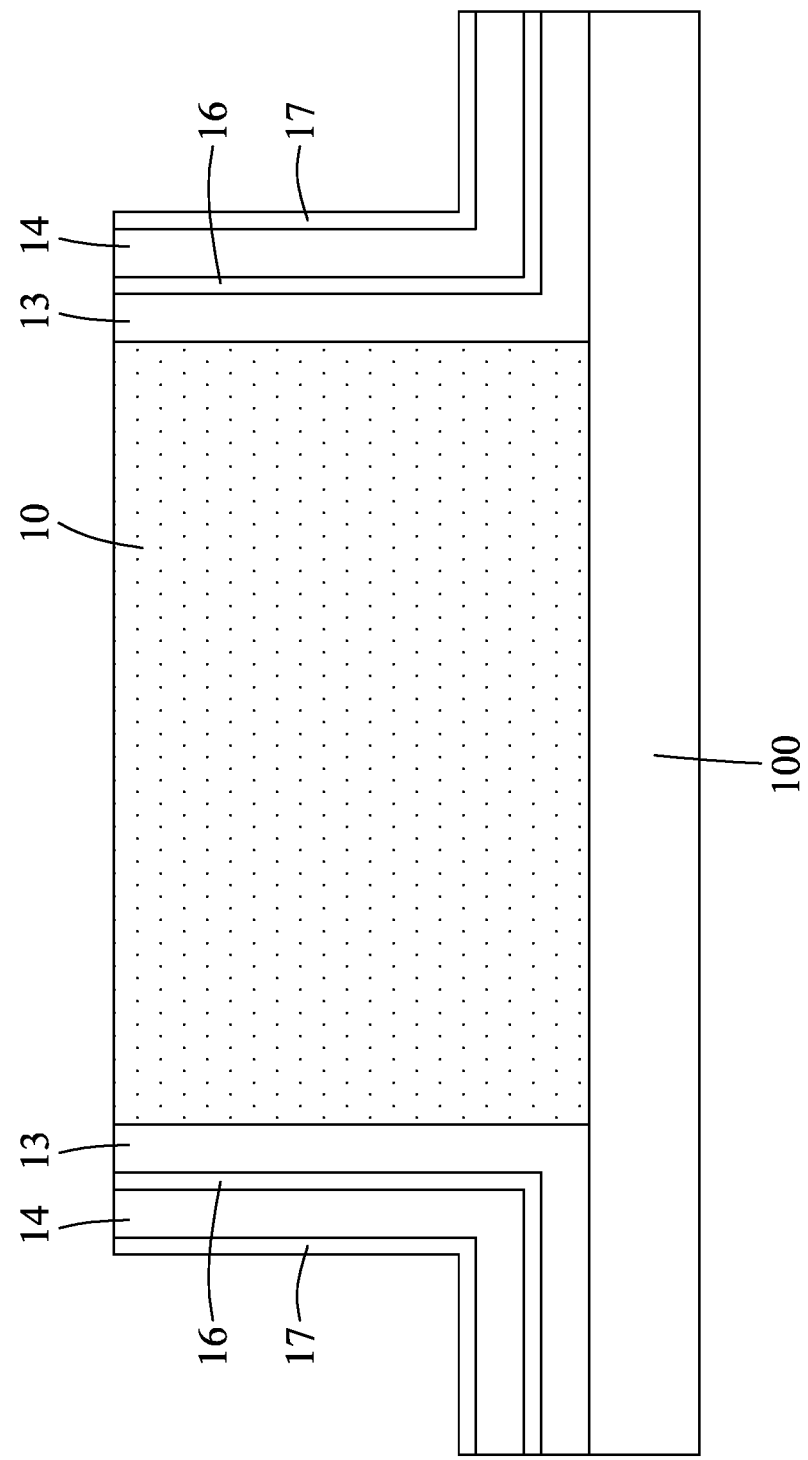

Referring to FIGS. 11 and 15, in step S114, a Si-containing gas is introduced to the second spacers 14, so that Si contained in the Si-containing gas reacts with the material of the second spacers 14 to form a second Si-rich layer 17 (or Si-containing layer) on a surface of the second spacers 14 (see FIG. 16). Similar to step S112, the treatment of the Si-containing gas is isotropic, but this disclosure is not limited in this respect. In accordance with some embodiments, the Si-containing gas treatment is performed at a temperature in a range from about 200° C. to about 600° C., a pressure in a range from about 1 mTorr to about 10 Torr, with a treatment duration in a range from about 10 seconds to about 600 seconds, so as to form the second Si-rich layer 17 that has a thickness in a range from about 5 angstroms to about 10 angstroms, which is sufficient to protect the second spacers 14 from being damaged in subsequent etch and/or annealing processes. If the process temperature is too low (e.g., lower than 200° C.), the Si-containing gas may not be able to effectively react with the low-k dielectric material. If the process temperature is too high (e.g., higher than 600° C.), undesired diffusion of Si into the low-k dielectric material may occur. If the process pressure is too low (e.g., lower than 1 mTorr), the Si-containing gas may not be able to effectively react with the low-k dielectric material. If the process pressure is too high (e.g., higher than 10 Torr), undesired contaminations of particles may occur. In accordance with some embodiments, the Si-containing gas may include, for example but not limited to, SiH$_4$, Si$_2$H$_6$, SiH$_x$Cl$_y$, other suitable materials, or any combination thereof, and can be either the same as or different from the Si-containing gas used in step S112. The Si-containing gas treatment in step S114 may be either an in-situ treatment or an ex-situ treatment. In the case that the second spacers 14 includes the B(C)N-based low-k dielectric material, the second Si-rich layer 17 formed by the reaction between the Si-containing gas and the material of the second spacers 14 may include, for example but not limited to, Si, SiN, SiBN, SiBCN, and so on, which can protect the second spacers 14 from being damaged in subsequent etch and/or annealing process. In the case that the second spacers 14 including the B(C)N-based low-k dielectric material have been oxidized to form B$_2$O$_3$, the second Si-rich layer 17 formed by the reaction between the Si-containing gas and the material of the second spacers 14 may further include SiO$_2$, which is generated by the reaction between Si of the Si-containing gas and oxygen of B$_2$O$_3$ and which is more stable than B$_2$O$_3$. In the case that the second spacers 14 includes the SiO$_x$C$_y$N$_z$-based low-k dielectric material, the Si-rich layer 16 formed by the reaction between the Si-containing gas and the material of the second spacers 14 may include, for example but not limited to, Si, SiN, SiON, SiO$_2$, and so on, which can protect the low-k dielectric material of the second spacers 14 from being damaged during subsequent etch and/or annealing processes.

Figure 17:
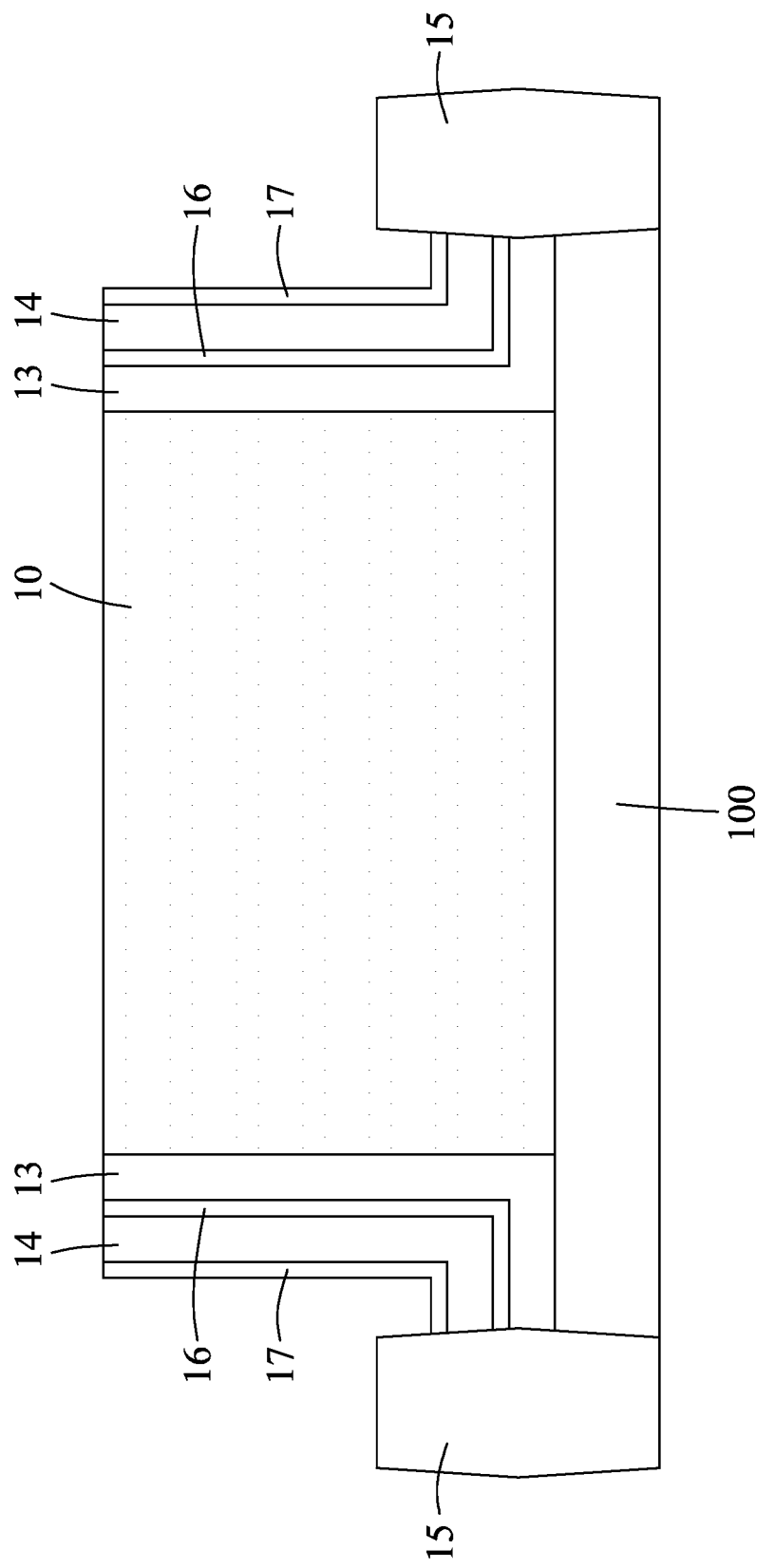

Referring to FIGS. 11 and 17, in step S115, source/drain features 15 are formed in the semiconductor feature 100 at opposite sides of the semiconductor feature 100. In detail, a part of the semiconductor feature 100 disposed at two opposite sides of the dummy gate 10, and the second Si-rich layer 17, the second spacers 14, the first Si-rich layer 16, and the first spacers 13 formed on the part of the semiconductor feature 100 are etched using, for example but not limited to, dry etching, wet etching, RIE, ALE, other suitable methods, or any combination thereof, so as to form recesses in the semiconductor feature 100 at the opposite sides of the semiconductor feature 100. The recesses are disposed at two opposite sides of the dummy gate 10. Then, the source/drain features 15 are formed in the recesses by, for example but not limited to, an epitaxy process.

Figure 18:
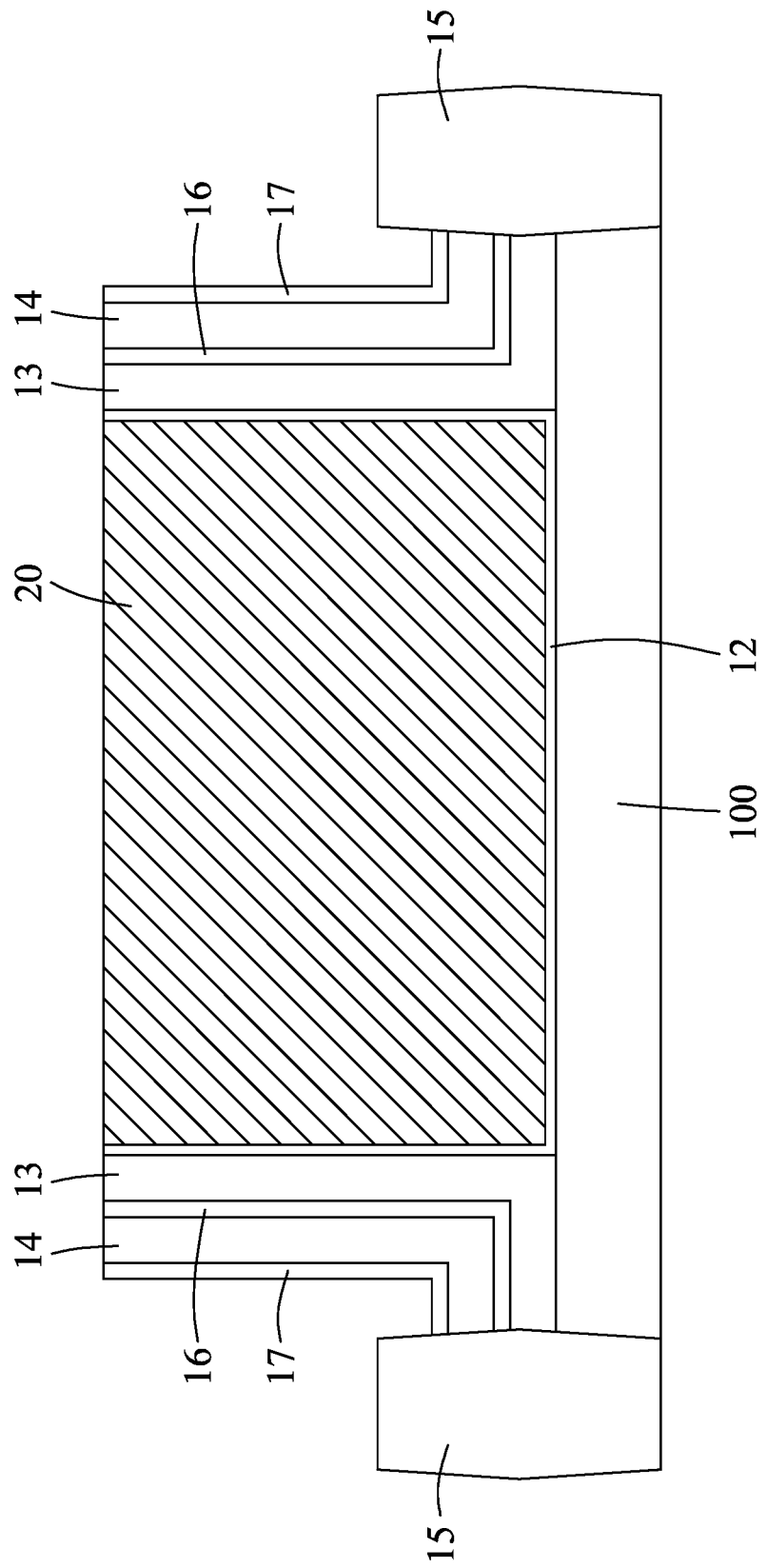

Referring to FIGS. 11 and 18, in step S116, a gate replacement process is performed to replace the dummy gate 10 with a gate dielectric 12 and a gate feature 20. In detail, the dummy gate 10 is etched by, for example but not limited to, dry etching, wet etching, RIE, ALE, other suitable methods, or any combination thereof, so as to form a trench between the first spacers 13. Then, the gate dielectric 12 is conformally formed in the trench using, for example but not limited to, PVD, CVD, ALD, other suitable methods, or any combination thereof. The gate dielectric 12 may be one or more dielectric layers and include a high-k dielectric material, such as metal oxide. In accordance with some embodiments, the gate dielectric 12 may include, for example but not limited to, LaO, AlO, ZrO, TiO, Ta$_2$O$_5$, Y$_2$O$_3$, SrTiO$_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, Si$_3$N$_4$, silicon oxynitrides (SiON), other suitable dielectric materials, or any combination thereof. Then, the gate feature 20 is formed on the gate dielectric 12 in the trench using, for example but not limited to, PVD, CVD, ALD, other suitable methods, or any combination thereof. The gate feature 20 may include metal or metal alloy that includes, for example but not limited to, Ti, Ag, Al, TiAlN, TaC, TaCN, TaSiN, Mn, Zr, TiN, TaN, Ru, Mo, Al, WN, Cu, W, other suitable materials, or any combination thereof.

As a result, the semiconductor device as exemplified in FIG. 18 includes a semiconductor feature 100, a pair of first spacers 13 (low-k features), a pair of second spacers 14 (low-k features) and a gate feature 20 formed on the semiconductor feature 100, a gate dielectric 12, a first Si-containing layer 16, a second Si-containing layer 17, and a pair of source/drain features 15 that are form at opposite sides of the semiconductor feature 100 (also at opposite sides of the gate feature 20). The first spacers 13 are respectively formed on opposite side walls of the gate feature 20 adjacent to the source/drain features 15 so that the first spacers 13 are spaced apart from each other by the gate feature 20. In certain embodiments, the first spacers 13 may also be formed on a surface of the semiconductor feature 100 located between the gate feature 20 and the source/drain features 15. The first Si-containing layer 16 contains silicon and is formed on the first spacers 13 oppositely of the gate structure 20. The second spacers 14 are formed on the first Si-containing layer 16 respectively opposite to the first spacers 13 so that the second spacers 14 are spaced apart from each other. Thus, the gate feature 20 is sandwiched between the first spacers 13, and also between the second spacers 14. The second Si-containing layer 17 contains silicon and is formed on the second spacers 14 that is opposite to the first Si-containing layer 16 (also opposite to the gate feature 20). The gate dielectric 12 is formed between the gate feature 20 and the first spacers 13 and between the gate feature 20 and the semiconductor feature 100.

Figure 19:
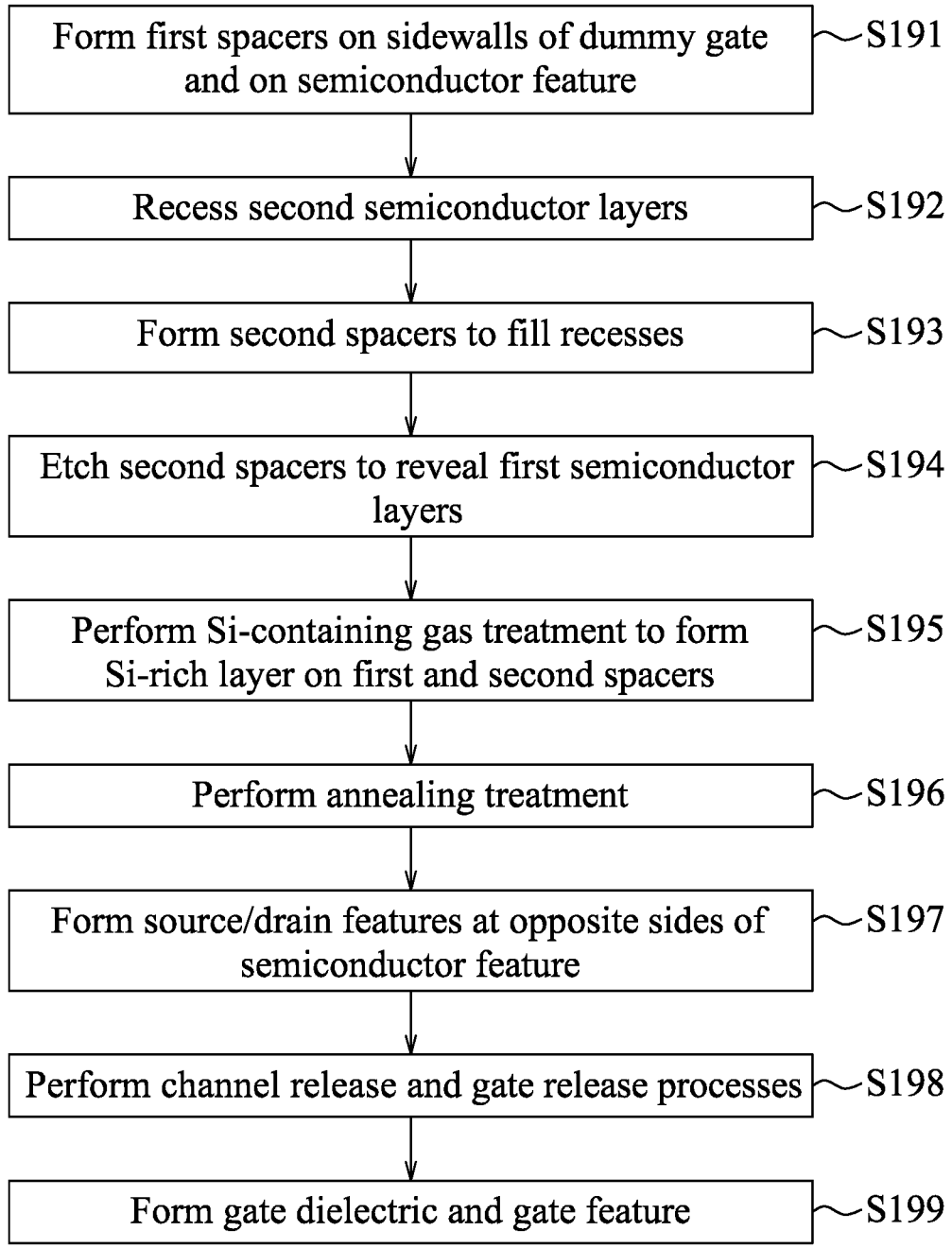
FIG. 19 is a flow chart illustrating steps of a method for protecting a low-k dielectric feature in accordance with some embodiments.

FIG. 19 illustrates a flow chart of a method for protecting a low-k dielectric feature in accordance with some embodiments. The flow chart is suitable for a semiconductor device having a structure as shown in FIG. 2.

Figure 20:
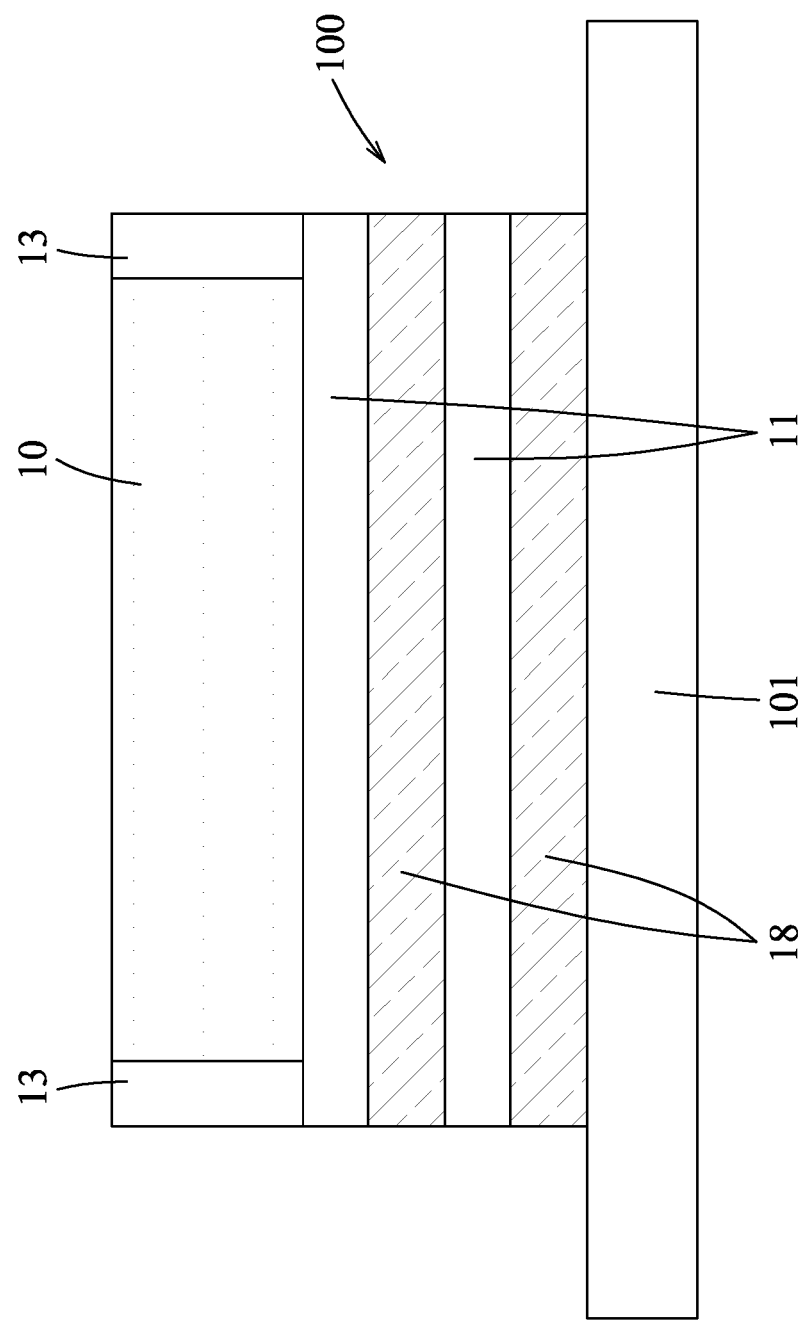
FIGS. 20 to 29 are schematic views illustrating intermediate stages of the method for protecting a low-k dielectric feature in accordance with some embodiments as depicted in FIG. 19.

Further referring to FIG. 20, a semiconductor feature 100 is formed on a semiconductor substrate 101 (e.g., a wafer), and is provided with a dummy gate 10 formed thereover. The semiconductor substrate 101 may include: an elemental (single element) semiconductor material, such as silicon, germanium, and/or other suitable materials; a compound semiconductor material, such as silicon carbide, gallium arsenic, gallium phosphide, indium phosphide, indium arsenide, indium antimonide, and/or other suitable materials; and/or an alloy semiconductor material, such as SiGe, GaAsP, AlInAs, AlGaAs, GaInAs, GaInP, GaInAsP, and/or other suitable materials. In the illustrative embodiment, the semiconductor feature 100 is a multilayer stack that includes first semiconductor layers 11 and second semiconductor layers 18 alternating with each other. The first semiconductor layers 11 include a semiconductor material different from that of the second semiconductor layers 18. In accordance with some embodiments, the first semiconductor layers 11 may include group IV semiconductor, group III-V semiconductor, group II-VI semiconductor, other suitable materials, or any combination thereof. In accordance with some embodiments, the second semiconductor layers 18 may include group IV semiconductor, group III-V semiconductor, group II-VI semiconductor, other suitable materials, or any combination thereof. In the illustrative embodiments, the first semiconductor layers 11 may be silicon layers and, the second semiconductor layers 18 may be SiGe layers, but this disclosure is not limited in this respect. In certain embodiments, the silicon layers are epitaxially formed by a low pressure chemical vapor deposition (LPCVD) process at a temperature ranging from about 400° C. to about 750° C. and under a pressure of about 10 Torr to about 200 Torr, using $SiH_2Cl_2$ or $SiH_4$ as reaction gases, and the SiGe layers are epitaxially formed by an LPCVD process at a temperature ranging from about 400° C. to about 800° C. and under a pressure of about 1 Torr to about 200 Torr, using $SiH_2Cl_2$ or $SiH_4$, $GeH_4$, and HCl, $B_2H_6$, or $H_2$ as reaction gases.

In some embodiments, the dummy gate 10 is made of, for example but not limited to, polysilicon, other suitable materials, or any combination thereof. In step S191, first spacers 13 are formed on sidewalls of the dummy gate 10 and on the semiconductor feature 100. In the illustrative embodiment, the first spacers 13 are a low-k dielectric feature that is made of a low-k dielectric material, for example but not limited to, $BC_xN_y$-based materials, $SiO_xC_yN_z$-based materials, other suitable materials, or any combination thereof, in order to reduce capacitance in circuits. The first spacers 13 may be formed using, for example but not limited to, CVD, ALD, other suitable methods, or any combination thereof, at a temperature in a range from about 200° C. to about 600° C. In accordance with some embodiments, the first spacers 13 may have a thickness in a range from about 50 angstroms to about 100 angstroms, but this disclosure is not limited in this respect. Excessively thin first spacers 13 (e.g., thinner than 50 angstroms) may lead to gate-to-drain or gate-to-source current leakages, and excessively thick first spacers 13 (e.g., thicker than 100 angstroms) may make the entire device unnecessarily large.

Figure 21:
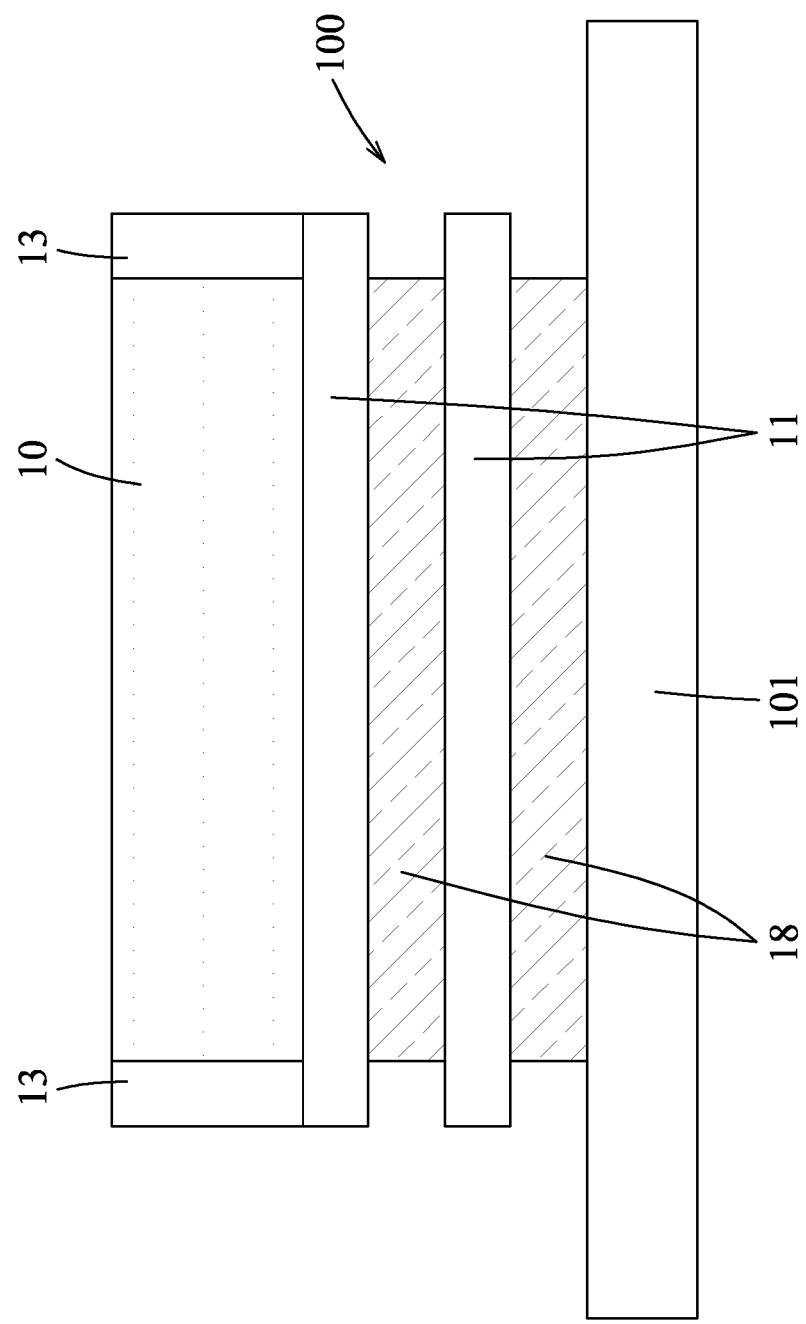

Referring to FIGS. 19 and 21, in step S192, the second semiconductor layers 18 are etched to form recesses at side portions thereof using, for example but not limited to, dry etching, wet etching, RIE, ALE, other suitable methods, or any combination thereof. In accordance with some embodiments, the etching of the second semiconductor layers 18 may be selective isotropic etching, but this disclosure is not limited in this respect. In the case that the second semiconductor layers 18 are SiGe layers, the second semiconductor layers 18 may be etched using an etchant, such as $NH_4OH/H_2O_2/H_2O$ (ammonia peroxide mixture, APM), $H_2SO_4/H_2O_2$ (sulfuric acid peroxide mixture, SPM), or the like.

Figure 22:
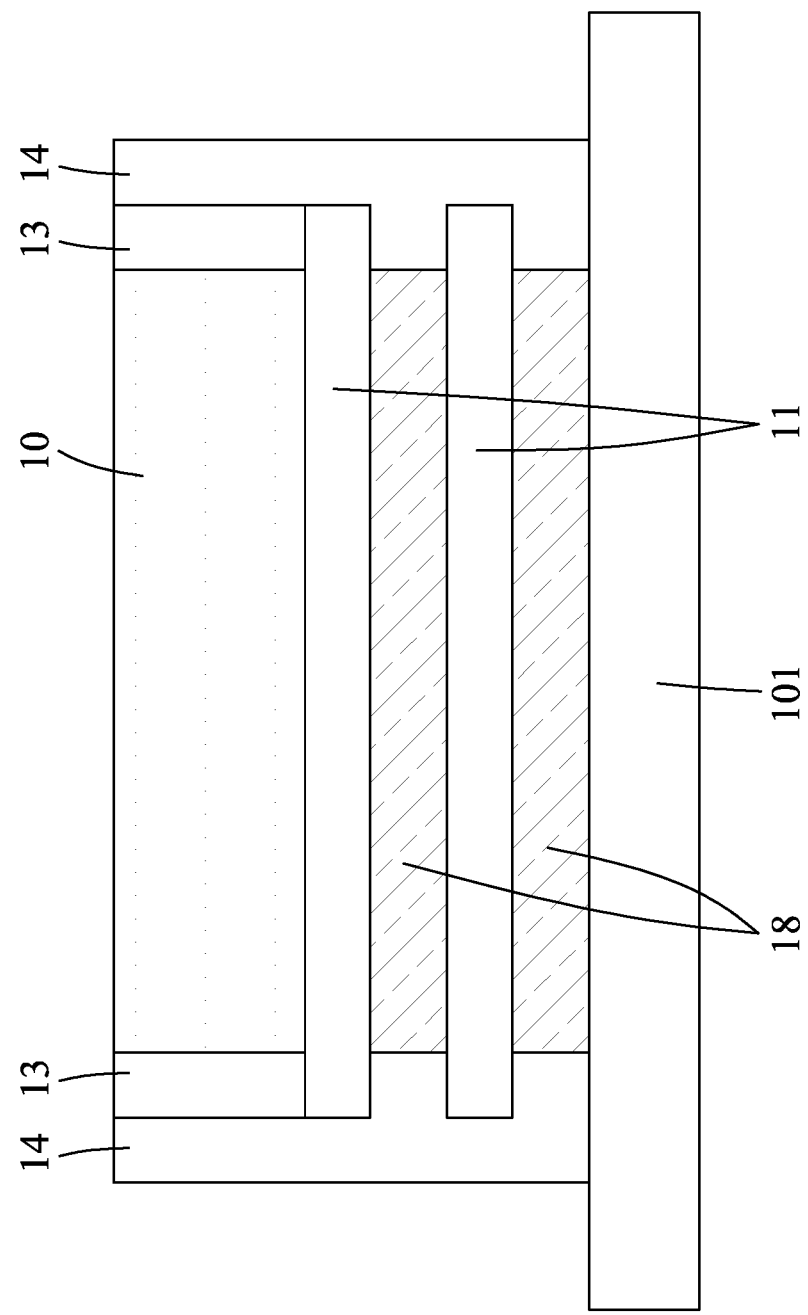

Referring to FIGS. 19 and 22, in step 5193, second spacers 14 are formed to fill the recesses formed in step S192 and also formed on the first spacer 13 oppositely of the dummy gate 10 and on side portions of the first semiconductor layers 11. In the illustrative embodiment, the second spacers 14 are a low-k dielectric feature that is made of a low-k dielectric material, for example but not limited to, $BC_xN_y$-based materials, $SiO_xC_yN_z$-based materials, other suitable materials, or any combination thereof, in order to reduce capacitance in circuits. The second spacers 14 may be formed using, for example but not limited to, CVD, ALD, other suitable methods, or any combination thereof, at a temperature in a range from about 200° C. to about 600° C. In such a structure, the first spacers 13 may be called outer spacers, and the second spacers 14 may be called inner spacers. In accordance with some embodiments, the first spacers 13 have a higher proportion of nitrogen in comparison to the second spacers 14 because the first spacers 13 are used to prevent diffusion of the high-k dielectric material from a gate dielectric 12 (see FIG. 28), which would be formed in a subsequent process.

Figure 23:
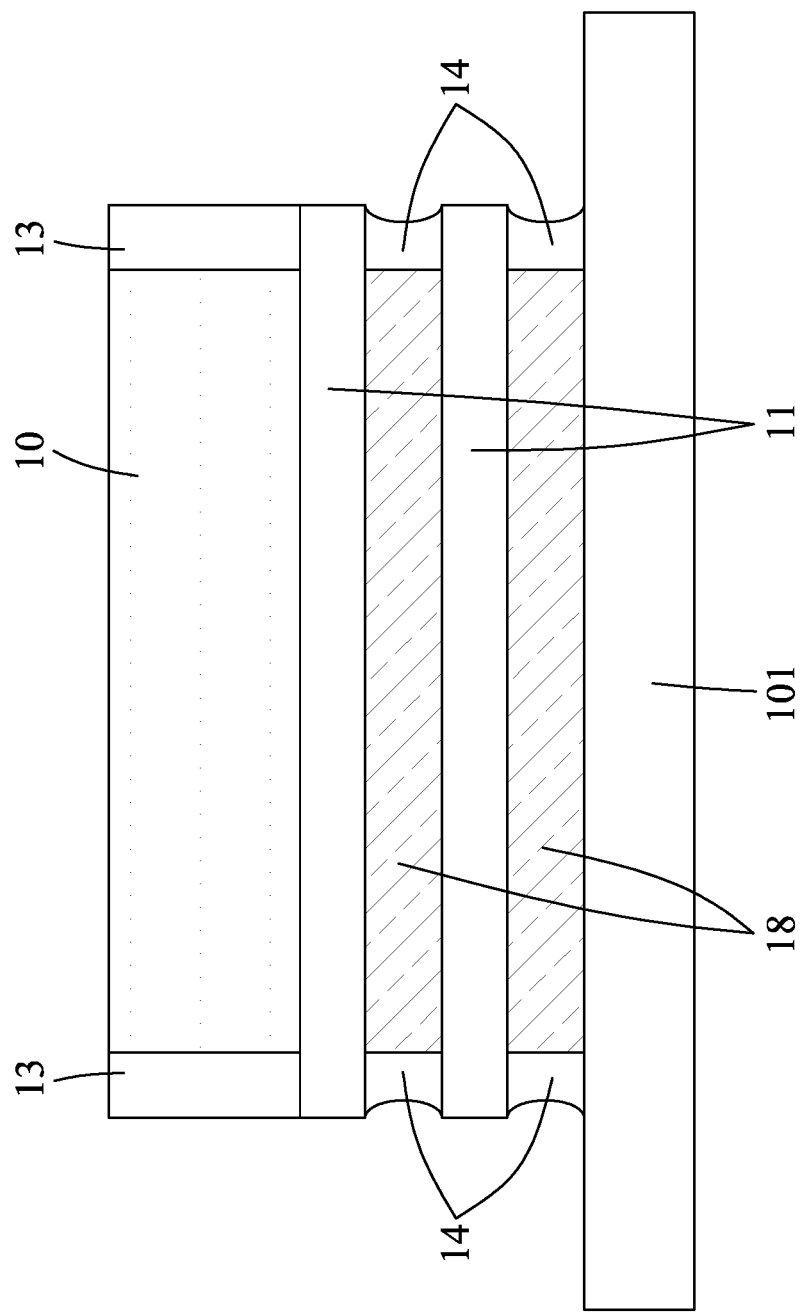

Referring to FIGS. 19 and 23, in step 5194, the second spacers 14 are partly etched to reveal the first semiconductor layers 11 and the first spacers 13 using, for example but not limited to dry etching, wet etching, RIE, ALE, other suitable methods, or any combination thereof. In accordance with some embodiments, the second spacers 14 remained in the recesses may have a thickness (a length in a horizontal direction in FIG. 23) in a range from about 10 angstroms to about 100 angstroms, but this disclosure is not limited in this respect. Excessively thin second spacers 14 (e.g., thinner than 50 angstroms) may lead to gate-to-drain or gate-to-source current leakages, and excessively thick second spacers 14 (e.g., thicker than 100 angstroms) may unnecessarily reduce lengths of gates that would subsequently replace the second semiconductor layers 18.

Figure 24:
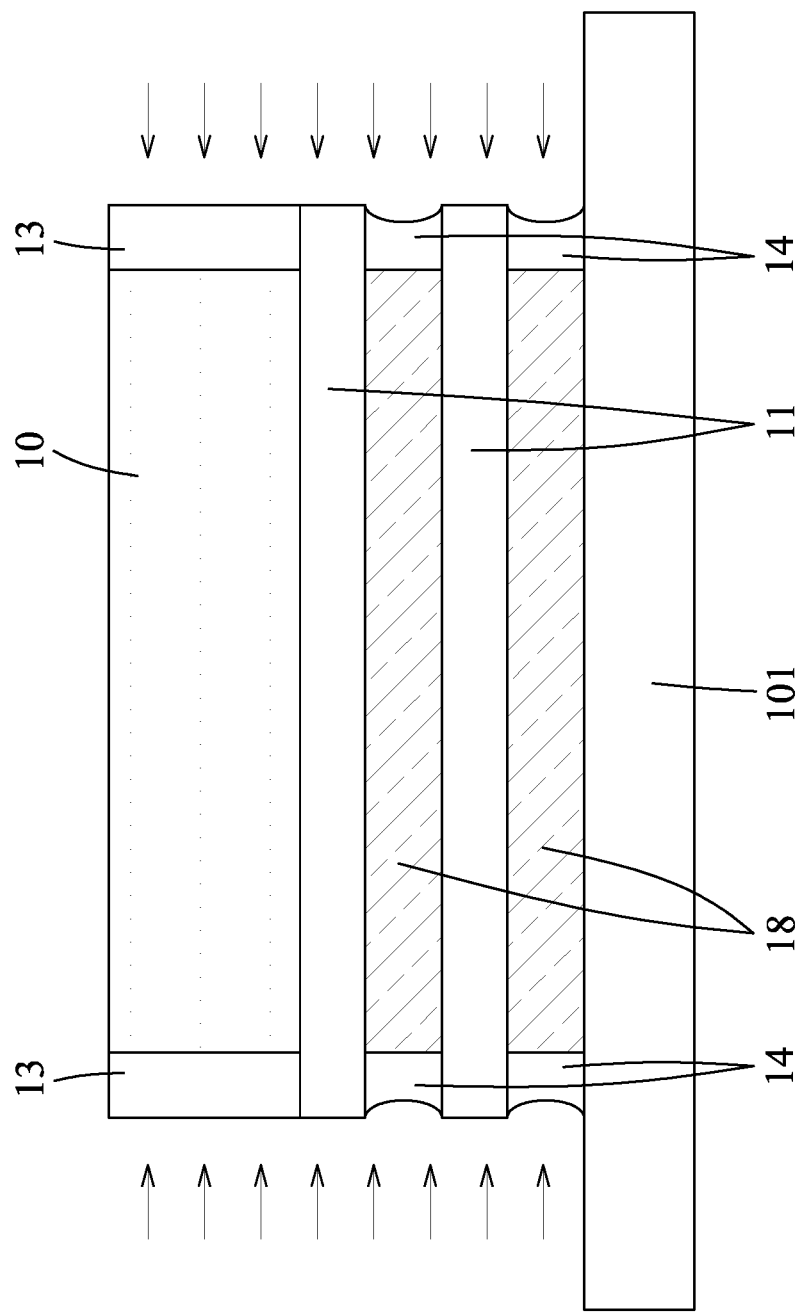
Figure 25:
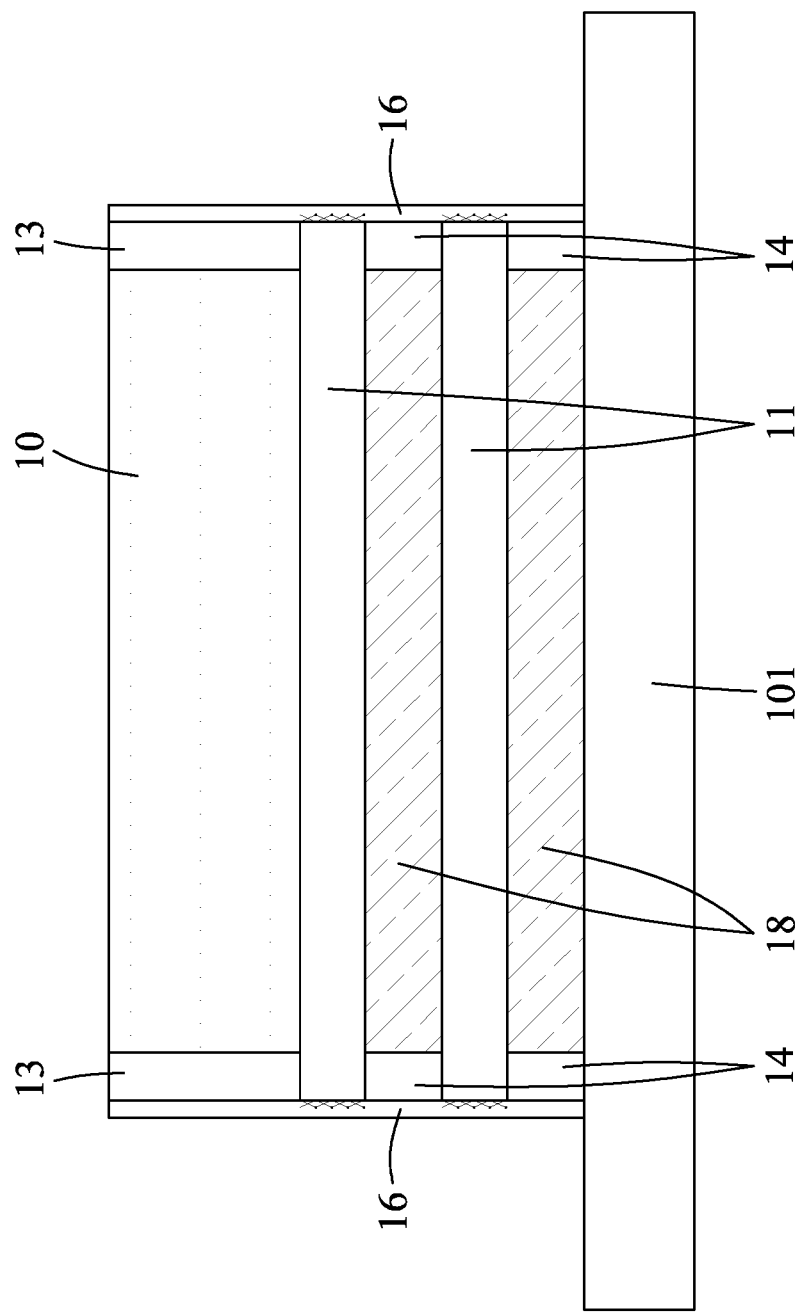

Referring to FIGS. 19 and 24, in step S195, a Si-containing gas is introduced to the first spacers 13, so that Si contained in the Si-containing gas reacts with the material of the first spacers 13 and the material of the second spacers 14 to form a Si-rich layer 16 (or Si-containing layer) on a surface of the first spacers 13 and a surface of the second spacers 14 (see FIG. 25). The treatment of the Si-containing gas is isotropic, but this disclosure is not limited in this respect. In accordance with some embodiments, the Si-containing gas treatment is performed at a temperature in a range from about 200° C. to about 600° C., a pressure in a range from about 1 mTorr to about 10 Torr, with a treatment duration in a range from about 10 seconds to about 600 seconds, so as to form the Si-rich layer 16 that has a thickness in a range from about 5 angstroms to about 10 angstroms, which is sufficient to protect the first spacers 13 and the second spacers 14 from being damaged in subsequent etch and/or annealing processes. If the process temperature is too low (e.g., lower than 200° C.), the Si-containing gas may not be able to effectively react with the low-k dielectric material. If the process temperature is too high (e.g., higher than 600° C.), undesired diffusion of Si into the low-k dielectric material may occur. If the process pressure is too low (e.g., lower than 1 mTorr), the Si-containing gas may not be able to effectively react with the low-k dielectric material. If the process pressure is too high (e.g., higher than 10 Torr), undesired contaminations of particles may occur. In accordance with some embodiments, the Si-containing gas may include, for example but not limited to, $SiH_4$, $Si_2H_6$, $SiH_xCl_y$, other suitable materials, or any combination thereof. The Si-containing gas treatment in step S194 may be either an in-situ treatment or an ex-situ treatment. Since the first spacers 13 and the second spacer 14 include B(C)N-based low-k dielectric materials in the illustrative embodiment, the Si-rich layer 16 formed by the reactions between the Si-containing gas and the material of the first spacers 13 and between the Si-containing gas and the material of the second spacers 14 may include, for example but not limited to, Si, SiN, SiBN, SiBCN, and so on, which can protect the first spacers 13 and the second spacers 14 from being damaged during subsequent etch and/or annealing processes. In the case that the first spacers 13 and the second spacers 14 including B(C)N-based low-k dielectric materials have been oxidized to form $B_2O_3$, the Si-rich layer 16 may further include $SiO_2$, which is generated by the reaction between Si of the Si-containing gas and oxygen of $B_2O_3$ and which is more stable than $B_2O_3$. In the case that the first spacers 13 and/or the second spacers 14 includes the $SiO_xC_yN_z$-based low-k dielectric material, the Si-rich layer 16 formed by the reaction between the Si-containing gas and the material of the first spacers 13 and the second spacers 14 may include, for example but not limited to, Si, SiN, SiON, $SiO_2$, and so on, which can protect the low-k dielectric material of the first spacers 13 and the second spacers 14 from being damaged during subsequent etch and/or annealing processes.

Figure 26:
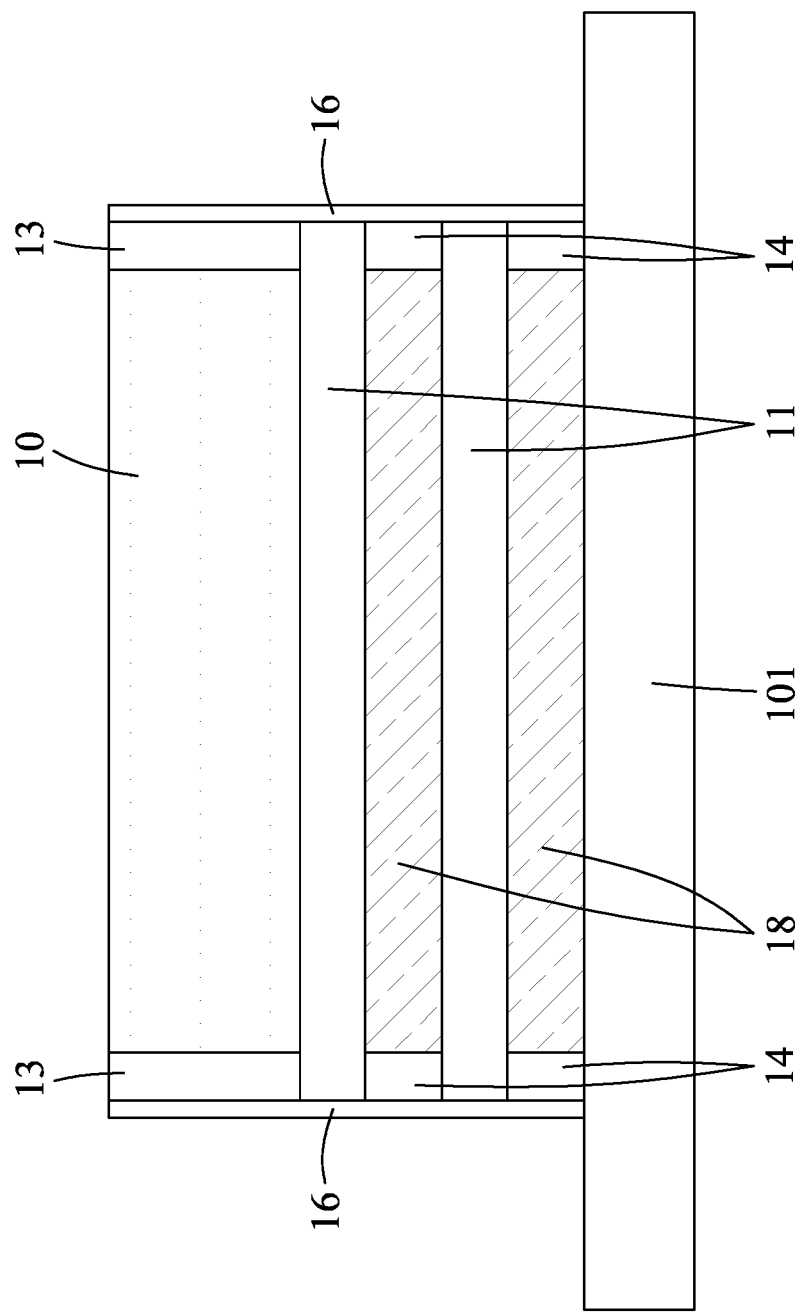

During the Si-containing gas treatment, the Si-containing gas may also react with the material of the first semiconductors layers 11, and the Si-rich layer 16 may also be formed on sidewalls of the first semiconductor layers 11. A portion of the Si-rich layer 16 formed on the sidewalls of the first semiconductor layers 11 is usually a silicon layer, which may include amorphous silicon or some defects (as denoted by marks "x" in FIG. 25), and which is different from the first semiconductor layers 11 that is usually single-crystalline silicon. In order to crystalize the amorphous silicon or to eliminate the defects in the Si-rich layer 16, in step S196, an annealing treatment is conducted to crystalize the amorphous silicon and/or reduce the defects in the Si-rich layer 16 (as illustrated in FIG. 26), thereby improving electric properties of the Si-rich layer 16.

Figure 27:
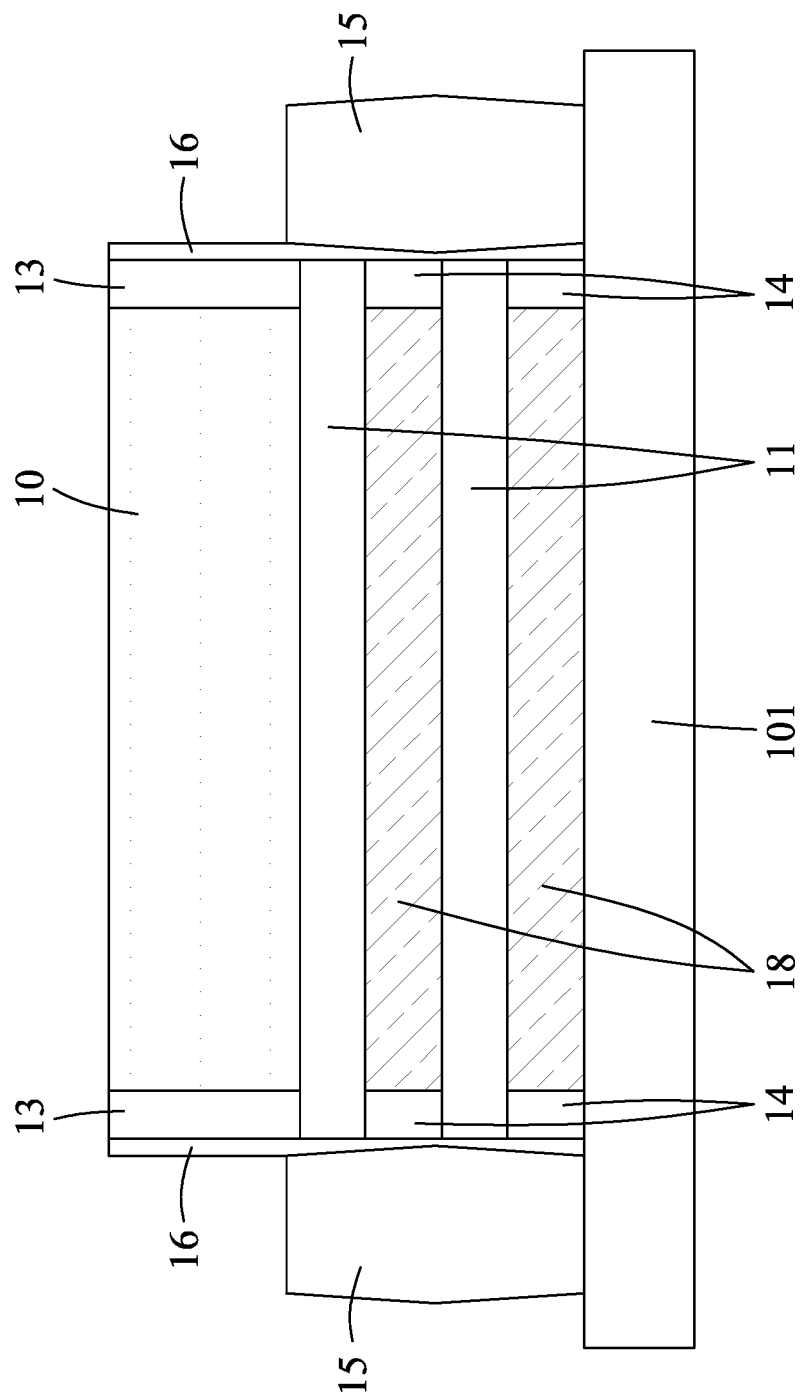

Referring to FIGS. 19 and 27, in step S197, source/drain features 15 are formed at opposite sides of the semiconductor feature 100 to be connected with the Si-rich layer 16 by, for example but not limited to, an epitaxy process.

Figure 28:
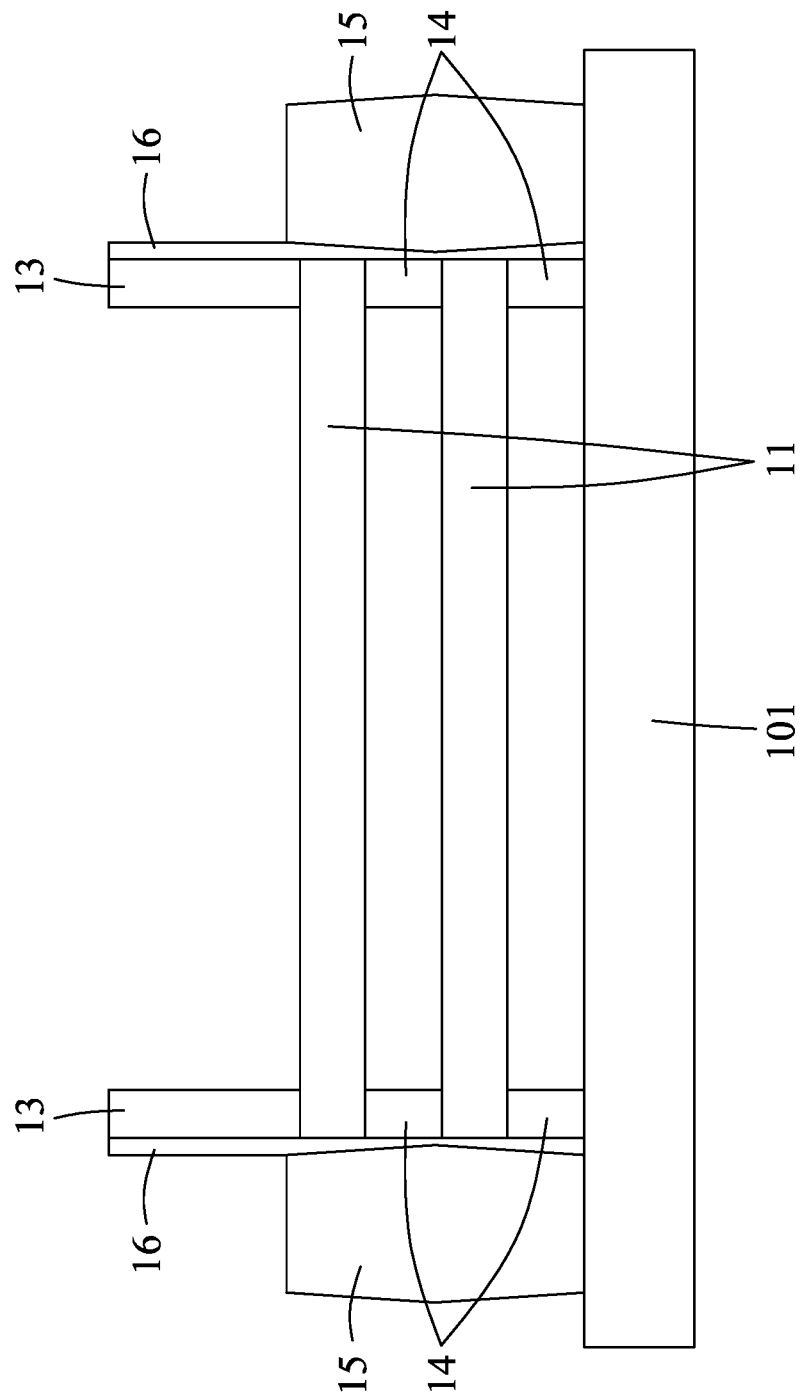

Referring to FIGS. 19 and 28, in step S198, a channel release process and a gate release process are performed to remove the second semiconductor layers 18 and the dummy gate 10 using, for example but not limited to, dry etching, wet etching, RIE, ALE, other suitable methods, or any combination thereof. In accordance with some embodiments, the channel release process may be performed prior to the gate release process, but this disclosure is not limited in this respect. As a result, the first semiconductor layers 11 are exposed.

Figure 29:
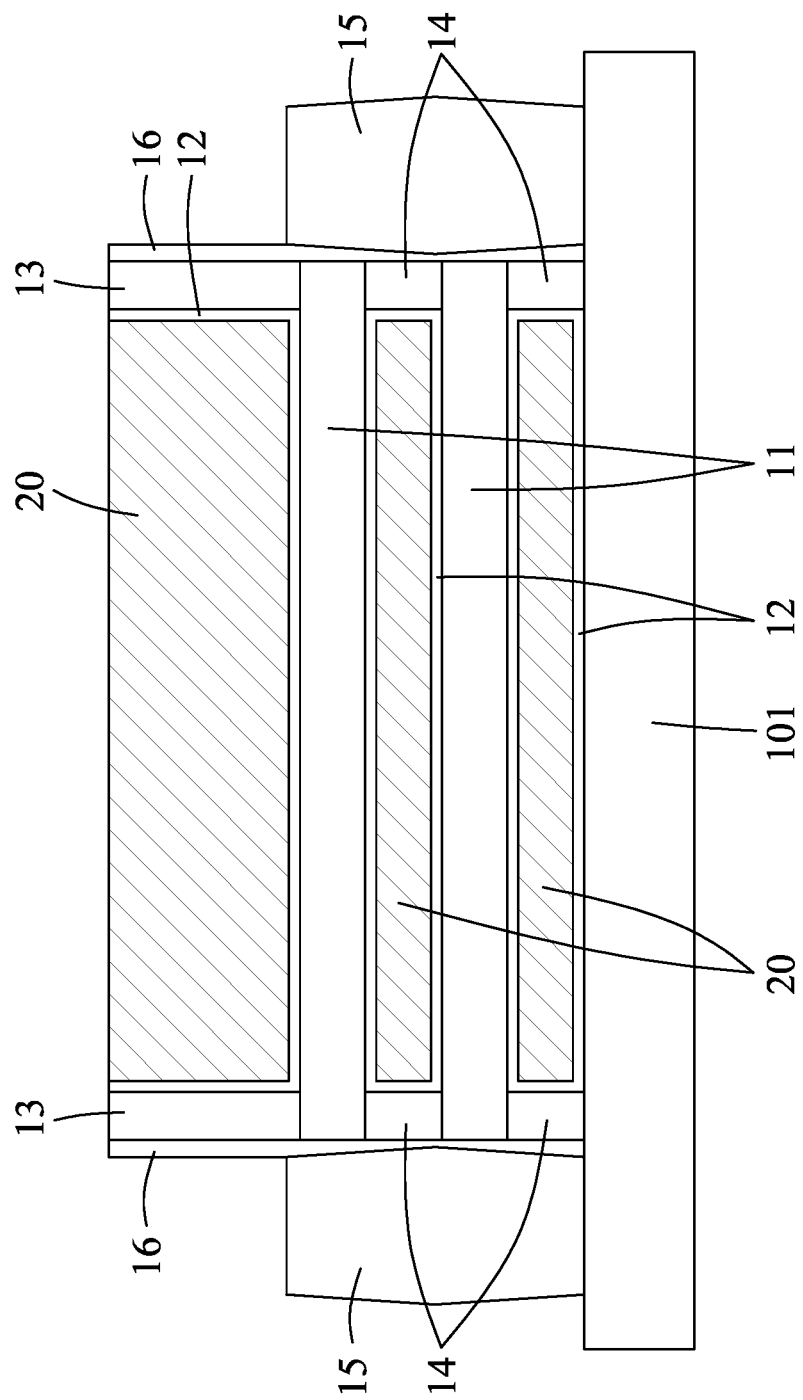

Referring to FIGS. 19 and 29, in step 5199, a gate dielectric 12 is formed on the first semiconductor layers 11 thus exposed, and a gate feature 20 is subsequently formed to surround the first semiconductor layers 11 that have been covered by the gate dielectric 12. The gate dielectric 12 may be formed using, for example but not limited to, PVD, CVD, ALD, other suitable methods, or any combination thereof. The gate dielectric 12 may be one or more dielectric layers and include a high-k dielectric material, such as metal oxide. In accordance with some embodiments, the gate dielectric 12 may include, for example but not limited to, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, silicon oxynitrides (SiON), other suitable dielectric materials, or any combination thereof. The gate feature 20 may be formed using, for example but not limited to, PVD, CVD, ALD, other suitable methods, or any combination thereof. The gate feature 20 may include metal or metal alloy that includes, for example but not limited to, Ti, Ag, Al, TiAlN, TaC, TaCN, TaSiN, Mn, Zr, TiN, TaN, Ru, Mo, Al, WN, Cu, W, other suitable materials, or any combination thereof.

As a result, the semiconductor device as exemplified in FIG. 29 includes semiconductor layers 11 (semiconductor feature, functions as channel layers), a pair of first spacers 13 (low-k feature), several pairs of second spacers 14 (low-k features) and a gate feature 20 formed on the semiconductor layers 11, a gate dielectric12, a Si-containing layer 16, and a pair of source/drain features 15 that are form at opposite sides of the semiconductor layers 11 (also at opposite sides of the gate feature 20). The gate feature 20 has an upper gate portion disposed over the topmost of the first semiconductor layers 11 and a lower gate portion surrounding the first semiconductor layers 11. The first spacers 13 are respectively formed on opposite side walls of the upper gate portion of the gate feature 20 so that the first spacers 13 are spaced apart from each other by the upper gate portion. The second spacers 14 are formed on opposite side walls of the lower gate portion of the gate feature 20 so that, for each of the several pairs of the second spacers 13, the second spacers are spaced apart from each other by the lower gate portion. Thus, the gate feature 20 is sandwiched between the first spacers 13 and between the second spacers 14. The gate dielectric 12 is formed between the gate feature 20 and the first spacers 13, between the gate feature 20 and the second spacers 14, and between the gate feature 20 and the semiconductor layers 11. The Si-containing layer 16 contains silicon and is formed on a sidewall surface of each of the first spacers 13 that is opposite to the gate feature 20, and on a sidewall surface of each of the second spacers 14 that is opposite to the gate feature 20.

It is noted that, although the FinFET and the GAAFET are used to exemplify the embodiments of this disclosure, the concept of this disclosure (i.e., applying the Si-containing gas treatment on a low-k dielectric feature to form a Si-containing protective layer on a surface of the low-k dielectric feature) is also applicable to other structures where low-k dielectric materials are used.

In summary, the embodiments of this disclosure propose to perform the Si-containing gas treatment on low-k dielectric features during a process of manufacturing semiconductor devices, so that the Si-containing gas reacts with the material of the low-k dielectric features to form a Si-rich or Si-containing layer on the surface of the low-k dielectric feature. The Si-containing layer may protect the low-k dielectric features from being damaged in subsequent etching and/or anneal processes. In some cases, the Si-containing gas may react with oxidized low-k material to induce reduction on the oxidized low-k material and form $SiO_2$, which is more stable than the oxidized low-k material.

In accordance with some embodiments, a semiconductor device is provided to include a semiconductor feature, a low-k dielectric feature that is formed on the semiconductor feature, and a Si-containing layer that contains silicon and that covers over the first low-k dielectric feature.

In accordance with some embodiments, the first Si-containing layer is thinner than the first low-k dielectric feature in a thickness direction.

In accordance with some embodiments, the first Si-containing layer has a thickness in a range from 5 angstroms to 10 angstroms.

In accordance with some embodiments, the first low-k dielectric feature includes boron and nitrogen, and the first Si-containing layer further contains at least one of boron or nitrogen.

In accordance with some embodiments, the first Si-containing layer includes at least one of Si, SiN, or SiBN.

In accordance with some embodiments, the first low-k dielectric feature further includes carbon, and the first Si-containing layer further contains carbon.

In accordance with some embodiments, the first Si-containing layer includes at least one of Si, SiN, SiBN, or SiBCN.

In accordance with some embodiments, the first Si-containing layer further contains $SiO_2$.

In accordance with some embodiments, the semiconductor device further includes a second low-k dielectric feature that covers over the first Si-containing layer; and a second Si-containing layer that contains silicon and that covers over the second low-k dielectric feature.

In accordance with some embodiments, the semiconductor device further includes a second low-k dielectric feature that is formed on the semiconductor feature and that is of different chemical composition from the first low-k dielectric feature, wherein the first Si-containing layer covers over both of the first low-k dielectric feature and the second low-k dielectric feature.

In accordance with some embodiments, a method for protecting a low-k dielectric feature of a semiconductor device is provided. In the method, a semiconductor feature is formed on a semiconductor substrate. A low-k dielectric feature is formed on the semiconductor feature. A first Si-containing gas that includes silicon is introduced to the first low-k dielectric feature to make the first Si-containing gas react with the first low-k dielectric feature to form a first Si-containing layer that covers over the first low-k dielectric feature.

In accordance with some embodiments, the first Si-containing gas includes at least one of $SiH_4$, $Si_2H_6$, or $SiH_xCl_y$, where x and y are positive integers.

In accordance with some embodiments, the first low-k dielectric feature includes elements of boron and nitrogen.

In accordance with some embodiments, the first low-k dielectric feature further includes elements of carbon.

In accordance with some embodiments, the step of introducing the Si-containing gas is performed at a temperature in a range from 200° C. to 600° C. and a pressure in a range from 1 mTorr to 10 Torr.

In accordance with some embodiments, the step of introducing the Si-containing gas is performed for a duration in a range from 10 seconds to 600 seconds to form the first Si-containing layer that has a thickness in a range from 5 angstroms to 10 angstroms.

In accordance with some embodiments, a second low-k dielectric feature is formed on the first Si-containing layer. A second Si-containing gas that includes silicon is introduced to the second low-k dielectric feature to make the second Si-containing gas react with the second low-k dielectric feature to form a second Si-containing layer that covers over the second low-k dielectric feature.

In accordance with some embodiments, before the step of introducing the first Si-containing gas, a second low-k dielectric feature that is of different chemical composition from the first low-k dielectric feature is formed on the semiconductor feature. The first Si-containing gas reacts with both of the first low-k dielectric feature and the second low-k dielectric feature to form the first Si-containing layer that covers over both of the first low-k dielectric feature and the second low-k dielectric feature.

In accordance with some embodiments, a semiconductor device is provided to include a semiconductor feature, a pair of low-k dielectric features, a gate feature, a gate dielectric, a Si-containing layer and a pair of source/drain features. The low-k dielectric features are formed on the semiconductor feature and that are spaced apart from each other. The gate feature is formed on the semiconductor feature and is sandwiched between the low-k dielectric features. The gate dielectric is formed between the gate feature and the low-k dielectric features and between the gate feature and the semiconductor feature. The Si-containing layer contains silicon and is formed on a sidewall surface of the low-k dielectric features that is opposite to the gate feature. The source/drain features that are form in the semiconductor feature and at opposite sides of the gate feature.

In accordance with some embodiments, the low-k dielectric features contain boron and nitrogen, and the Si-containing layer further contains at least one of boron or nitrogen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device, comprising:
  a semiconductor feature; and a first low-k dielectric feature formed on the semiconductor feature, and including a body portion and a surface portion,
wherein the surface portion conformally covers over the body portion, and contains silicon and at least one element that is contained in the body portion,
wherein the surface portion has a greater concentration of silicon than the body portion, and
wherein the surface portion is thinner than the body portion in a thickness direction.

2. The semiconductor device according to claim 1, wherein the surface portion has a thickness in a range from 5 angstroms to 10 angstroms.

3. The semiconductor device according to claim 1, wherein the body portion of the first low-k dielectric feature is made of $BC_xN_y$, where x is greater than or equal to zero, and y is a positive number.

4. The semiconductor device according to claim 3, wherein the surface portion includes at least one of SiN, SiBCN or SiBN.

5. The semiconductor device according to claim 3, wherein the first low-k dielectric feature further includes carbon, and the surface portion further contains carbon.

6. The semiconductor device according to claim 1, wherein the surface portion includes at least one of SiN, SiBN, or SiBCN.

7. The semiconductor device according to claim 3, wherein the surface portion further contains $SiO_2$.

8. The semiconductor device according to claim 1, further comprising:
a second low-k dielectric feature covering over the surface portion of the first low-k dielectric feature, and including a body portion and a surface portion,
wherein the surface portion of the second low-k dielectric feature contains silicon, has a greater concentration of silicon than the body portion of the second low-k dielectric feature, and covers over the body portion of the second low-k dielectric feature.

9. The semiconductor device according to claim 1, wherein the surface portion of the first low-k dielectric feature is L-shaped.

10. The semiconductor device according to claim 1, wherein the body portion of the first low-k dielectric feature includes carbon, boron and nitrogen, and the surface portion of the first low-k dielectric feature further contains carbon and one or both of boron and nitrogen.

11. The semiconductor device according to claim 1, further comprising a second low-k dielectric feature disposed between the first low-k dielectric feature and the semiconductor feature, wherein the second low-k dielectric feature is of different chemical composition from the first low-k dielectric features.

12. The semiconductor device according to claim 1, further comprising a second low-k dielectric feature formed on the semiconductor feature, and including a body portion and a surface portion;
wherein the surface portion conformally covers over the body portion, and contains silicon and at least one element that is contained in the body portion;
wherein the surface portion has a greater concentration of silicon than the body portion; and
wherein the surface portion is thinner than the body portion in a thickness direction;
wherein the body portion of the second low-k dielectric feature is spaced apart from the body portion of the first low-k dielectric feature.

13. The semiconductor device according to claim 12, further comprising a silicon-containing feature that interconnects the surface portion of the second low-k dielectric feature and the surface portion of the first low-k dielectric feature.

14. A semiconductor device, comprising:
a semiconductor feature;
a pair of first low-k dielectric features formed on the semiconductor feature and spaced apart from each other;
a gate feature formed on the semiconductor feature and sandwiched between the first low-k dielectric features;
a gate dielectric formed between the gate feature and the first low-k dielectric features and between the gate feature and the semiconductor feature;
a Si-containing layer formed on a sidewall surface of the first low-k dielectric features that is opposite to the gate feature; and
a pair of source/drain features formed in the semiconductor feature and at opposite sides of the gate feature,
wherein the Si-containing layer is L-shaped, and has an end lower than a top surface of one of the source/drain features,
wherein the one of the source/drain features has a sidewall facing the other one of the source/drain features, and the end of the Si-containing layer is in contact with the sidewall of the one of the source/drain features, and
wherein the first low-k dielectric feature includes carbon, boron and nitrogen, and the Si-containing layer further contains carbon and one or both of boron and nitrogen.

15. The semiconductor device according to claim 14, wherein the Si-containing layer is thinner than the first low-k dielectric features in a thickness direction.

16. The semiconductor device according to claim 14, wherein the Si-containing layer further contains $SiO_2$.

17. The semiconductor device according to claim 14, further comprising a pair of second low-k dielectric features that are formed on the semiconductor feature, that sandwich the gate feature therebetween, and that are of different chemical composition from the first low-k dielectric features, wherein the Si-containing layer covers over both of the first low-k dielectric features and the second low-k dielectric features.

18. A semiconductor device, comprising:
a semiconductor feature;
a gate dielectric formed over the semiconductor feature;
a gate feature formed over the gate dielectric feature;
a pair of first low-k dielectric features that are respectively formed at opposite sides of the gate feature; and
a Si-containing layer conformally formed over the first low-k dielectric features,
wherein the first low-k dielectric features are made of $BC_xN_y$, where x is greater than or equal to zero, and y is a positive number,
wherein the Si-containing layer contains at least one of boron, carbon or nitrogen, and
wherein the semiconductor device further comprises a pair of second low-k dielectric features that are of different chemical composition from the first low-k dielectric features, each of the second low-k dielectric features being disposed between the Si-containing layer and a respective one of the first low-k dielectric features.

19. The semiconductor device according to claim 18, wherein the first low-k dielectric features have a higher proportion of nitrogen than the second low-k dielectric features.

20. The semiconductor device according to claim 18, wherein the Si-containing layer further contains $SiO_2$.

\* \* \* \* \*